United States Patent
Han et al.

(10) Patent No.: US 11,068,092 B2
(45) Date of Patent: Jul. 20, 2021

(54) DISPLAY APPARATUS HAVING INPUT SENSING UNIT

(71) Applicant: Samsung Display Co., Ltd., Yongin-si (KR)

(72) Inventors: Jeongyun Han, Hwaseong-si (KR); Jong-Hwa Kim, Yongin-si (KR); Kyungsu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 61 days.

(21) Appl. No.: 16/547,098

(22) Filed: Aug. 21, 2019

(65) Prior Publication Data
US 2020/0142525 A1     May 7, 2020

(30) Foreign Application Priority Data
Nov. 7, 2018 (KR) .................... 10-2018-0135979

(51) Int. Cl.
| | |
|---|---|
| *G06F 3/041* | (2006.01) |
| *G02F 1/1333* | (2006.01) |
| *H01L 27/32* | (2006.01) |
| *G06F 1/16* | (2006.01) |

(52) U.S. Cl.
CPC ........ *G06F 3/0412* (2013.01); *G02F 1/13338* (2013.01); *G06F 1/1637* (2013.01); *H01L 27/3262* (2013.01)

(58) Field of Classification Search
None
See application file for complete search history.

(56) References Cited

U.S. PATENT DOCUMENTS

| | | | |
|---|---|---|---|
| 8,179,381 B2 | 5/2012 | Frey et al. | |
| 10,171,636 B2 | 1/2019 | Yeo et al. | |
| 2017/0287992 A1 | 10/2017 | Kwak et al. | |
| 2018/0095584 A1* | 4/2018 | Lee ................. | H01L 27/3213 |
| 2018/0157362 A1 | 6/2018 | Kim et al. | |
| 2019/0043452 A1 | 2/2019 | Silvanto et al. | |
| 2019/0079622 A1* | 3/2019 | Choi ................. | G06F 3/0446 |

FOREIGN PATENT DOCUMENTS

| | | |
|---|---|---|
| KR | 10-2017-0111827 | 10/2017 |
| KR | 10-2017-0112790 | 10/2017 |
| KR | 10-786119 | 10/2017 |
| KR | 10-2018-0042351 | 4/2018 |
| KR | 10-2018-0063633 | 6/2018 |
| KR | 10-2020-0042071 | 4/2020 |

* cited by examiner

*Primary Examiner* — Carl Adams
(74) *Attorney, Agent, or Firm* — H.C. Park & Associates, PLC

(57) ABSTRACT

A display apparatus including a base substrate including front and rear surfaces facing each other and in which a module hole passing through the first and rear surfaces is defined, a circuit layer including a driving element, a display element layer including a light emitting element, an encapsulation layer, and an input sensing unit. A routing area surrounding the module hole is defined in the base substrate. The input sensing unit includes a first touch line, a second touch line, and a bridge pattern. The first touch line includes first touch sensing parts arranged in a preset direction. The second touch line is insulated from and cross the first touch line. The bridge pattern is connected to the first touch sensing parts adjacent to the preset direction with the module hole therebetween and be disposed within the routing area. A slit is provided in the bridge pattern.

18 Claims, 14 Drawing Sheets

DISPLAY APPARATUS HAVING INPUT SENSING UNIT

CROSS-REFERENCE TO RELATED APPLICATION

This application claims priority from and the benefit of Korean Patent Application No. 10-2018-0135979, filed on Nov. 7, 2018, which is hereby incorporated by reference for all purposes as if fully set forth herein.

BACKGROUND

Field

Exemplary embodiments of the invention relate generally to a display apparatus, and more specifically, to a display apparatus including an input sensing unit.

Discussion of the Background

Display apparatuses are activated according to electrical signals. Such a display apparatus may include devices constituted by various electronic components, such as a display unit displaying an image and an input sensing unit sensing an external input. The electronic components may be electrically connected to each other by signal lines, which are variously arranged.

The display unit includes a light emitting element that generates an image. The input sensing unit may include sensing electrodes for sensing an external input. Such a display apparatus, in which the display unit and the input sensing unit are provided in one panel, may have an undesirably large thickness and high process cost.

The above information disclosed in this Background section is only for understanding of the background of the inventive concepts, and, therefore, it may contain information that does not constitute prior art.

SUMMARY

The Exemplary embodiments of the invention provide an apparatus including a display panel having a module hole, which does not suffer deterioration in display quality when electrically connecting touch sensing parts disconnected by a module hole to each other.

Additional features of the inventive concept will be set forth in the description which follows, and in part will be apparent from the description, or may be learned by practice of the inventive concepts.

An exemplary embodiment of the inventive concept provides a display apparatus including a base substrate, a circuit layer, a display element layer, an encapsulation layer, and an input sensing unit.

The base substrate may include front and rear surfaces facing each other, have a module hole passing through the first and rear surfaces is defined, and have an active area, a peripheral area adjacent to the active area, and a routing area surrounding the module hole are defined on a plane.

The circuit layer may be disposed on the base substrate and include a driving element including a thin film transistor.

The display element layer may be disposed on the circuit layer and include a light emitting element disposed on the active area.

The encapsulation layer may be disposed on the display element layer to seal the light emitting element.

The input sensing unit may be disposed on the encapsulation layer.

The input sensing unit may include first touch sensing parts, a first connection part, second touch sensing parts, a second connection part, a first bridge pattern, and a second bridge pattern.

The first touch sensing parts may be arranged in a first direction. The first connection part may be configured to connect the adjacent first touch sensing parts to each other. The second touch sensing parts may be arranged in a second direction crossing the first direction. The second connection part may be configured to connect the adjacent second touch sensing parts to each other and be disposed on a layer different from that on which the first connection part is disposed. The first bridge pattern may be connected to the second touch sensing parts adjacent to each other in the second direction with the module hole therebetween and be disposed within the routing area. The second bridge pattern may be connected to the first touch sensing pars adjacent to each other in the first direction with the module hole therebetween and be disposed within the routing area. A first slit may be provided in at least one of the first bridge pattern and the second bridge pattern.

The first slit may be provided in an intersection between the first bridge pattern and the second bridge pattern.

The first slit may be provided in the first bridge pattern to overlap the second bridge pattern.

A second slit may be provided in the second bridge pattern to overlap the first bridge pattern.

The first bridge pattern and the second bridge pattern may be disposed on layers different from each other.

The first touch sensing parts, the second touch sensing parts, the second connection part, and the first bridge pattern may be disposed on the same layer. The second bridge pattern may be disposed on the same layer as the first connection part.

The input sensing unit may include a first touch insulation layer and a second touch insulation layer. The first touch insulation layer may be disposed on the first touch sensing parts, the second touch sensing parts, the second connection part, and the first bridge pattern. The second touch insulation layer may be disposed on the first connection part and the first touch insulation layer. The second bridge pattern may be connected to the first touch sensing part through a contact hole provided in the first touch insulation layer.

The first bridge pattern may include a sensing body pattern, a first sensing connection pattern, and a second sensing connection pattern. The sensing body pattern may be disposed within the routing area and have a bent shape. The first sensing connection pattern may extend from one end of the sensing body pattern and be connected to one of the second touch sensing parts. The second sensing connection pattern may extend from the other end of the sensing body pattern and be connected to the other one of the second touch sensing parts. The sensing body pattern may have a width greater than that of each of the first sensing connection pattern and the second sensing connection pattern.

The second bridge pattern may include a transmission body pattern, a first transmission connection pattern, and a second transmission connection pattern. The transmission body pattern may be disposed within the routing area and having a bent shape. The first transmission connection pattern may be connected to one end of the transmission body pattern and be connected one of the first touch sensing parts. The second transmission connection pattern may be connected to the other end of the transmission body pattern and be connected to the other one of the first touch sensing parts. The transmission body pattern may have a width greater than that of each of the first transmission connection pattern and the second transmission connection pattern.

The transmission body pattern may be disposed on a layer different from layers on which each of the first and second transmission connection patterns is disposed.

The first touch sensing parts, the second touch sensing parts, the second connection part, the first bridge pattern, and the transmission body pattern may be disposed on the same layer. The first transmission connection pattern, the second transmission connection pattern, and the first connection part may be disposed on the same layer.

The first bridge pattern may include a sensing body pattern, a first sensing connection pattern, and a second sensing connection pattern. The sensing body pattern may be disposed within the routing area and have a bent shape. The first sensing connection pattern may be connected to one end of the sensing body pattern, be connected to one of the second touch sensing parts, and be disposed on a layer different from that on which the sensing body pattern is disposed. The second sensing connection pattern may be connected to the other of the sensing body pattern, be connected to the other one of the second touch sensing parts, and be disposed on a layer different from that on which the sensing body pattern is disposed.

The second bridge pattern may include a transmission body pattern, a first transmission connection pattern, and a second transmission connection pattern. The transmission body pattern may be disposed within the routing area and having a bent shape. The first transmission connection pattern may be connected to one end of the transmission body pattern, be connected to one of the first touch sensing parts, and be disposed on a layer different from that on which the transmission body pattern is disposed. The second transmission connection pattern may be connected to the other of the transmission body pattern, be connected to the other one of the first touch sensing parts, and be disposed on a layer different from that on which the transmission body pattern is disposed.

The first touch sensing parts, the second touch sensing parts, the second connection part, the sensing body pattern, and the transmission body pattern may be disposed on the same layer. The first sensing connection pattern, the second sensing connection pattern, the first transmission connection pattern, and the second transmission connection part may be disposed on the same layer.

Each of the sensing body pattern and the transmission body pattern may surround the module hole and have an annular shape.

The first bridge pattern may further include an auxiliary sensing pattern disposed between the sensing body pattern and the module hole, and each of the first and second sensing connection patterns may be connected to the auxiliary sensing pattern. The second bridge pattern may further include an auxiliary transmission pattern disposed between the transmission body pattern and the module hole, and each of the first and second transmission connection patterns may be connected to the auxiliary transmission pattern.

The input sensing unit may further include a dummy pattern disposed within the routing area and disposed between the first bridge pattern and the second bridge pattern.

The routing area may be surrounded by the active area on the plane.

Another exemplary embodiment of the invention provides a display apparatus including a base substrate, a circuit layer, a display element layer, an encapsulation layer, and an input sensing unit.

The base substrate may include front and rear surfaces facing each other, have a module hole passing through the first and rear surfaces is defined, and have an active area, a peripheral area adjacent to the active area, and a routing area surrounding the module hole are defined on a plane.

The circuit layer may be disposed on the base substrate and include a driving element including a thin film transistor.

The display element layer may be disposed on the circuit layer and include a light emitting element disposed on the active area.

The encapsulation layer may be disposed on the display element layer to seal the light emitting element.

The input sensing unit may be disposed on the encapsulation layer.

The input sensing unit may include a first touch line, a second touch line, and a first bridge pattern.

The first touch line may include first touch sensing parts arranged in a first direction.

The second touch line may include second touch sensing parts arranged in a second direction crossing the first direction and be insulated from the first touch line.

The first bridge pattern may be disposed within the routing area and connected to the second touch sensing parts adjacent to each other in the second direction with the module hole therebetween and may have a first slit.

The input sensing unit may further include a second bridge pattern. The second bridge pattern may be disposed within the routing area and be connected to the first touch sensing parts adjacent to each other in the first direction with the module hole therebetween. The first slit may be provided in an intersection between the first bridge pattern and the second bridge pattern.

A recess pattern configured to surround the module hole may be disposed between the routing area and the module hole in the base substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
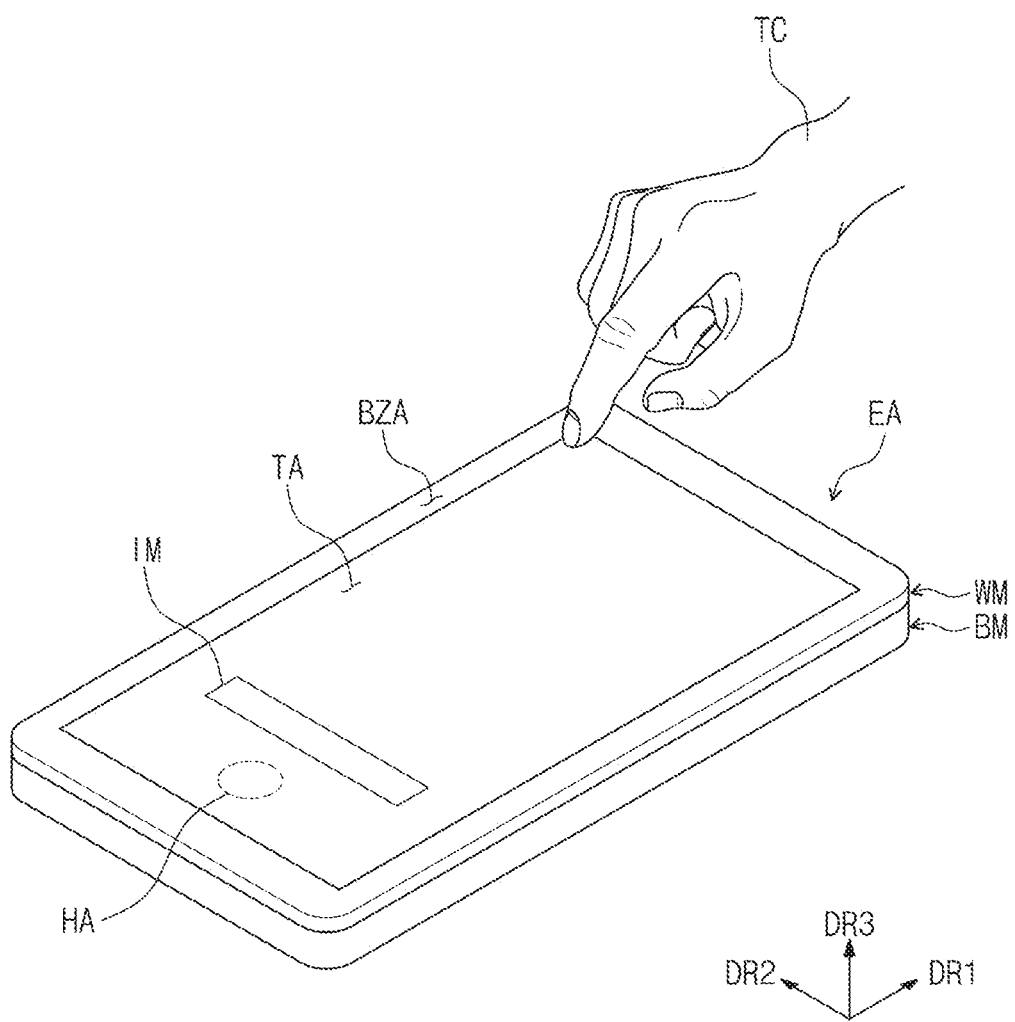
FIG. 1 is a perspective view of a display apparatus according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
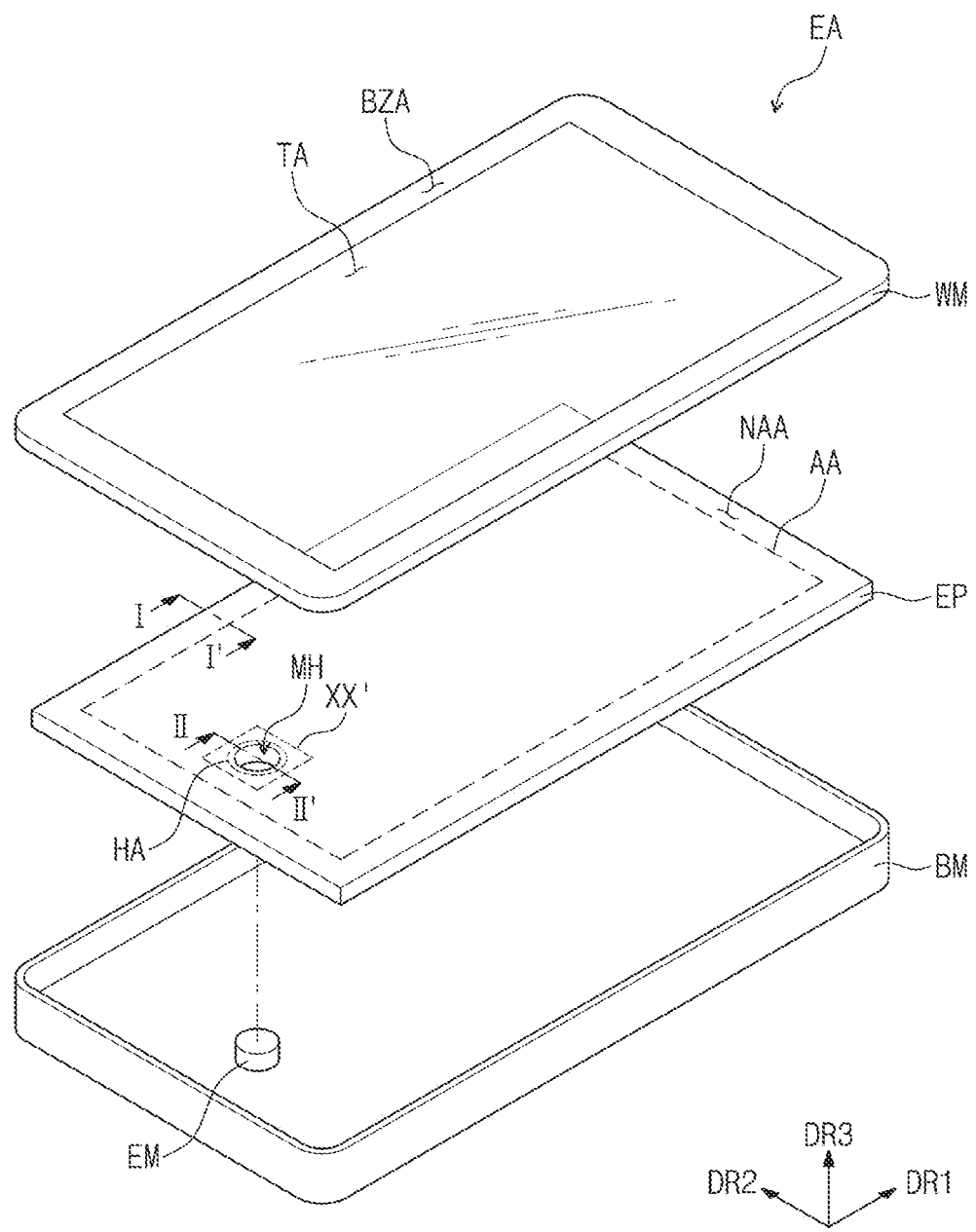
FIG. 2 is an exploded perspective view of the display apparatus of FIG. 1.
Figure 3:
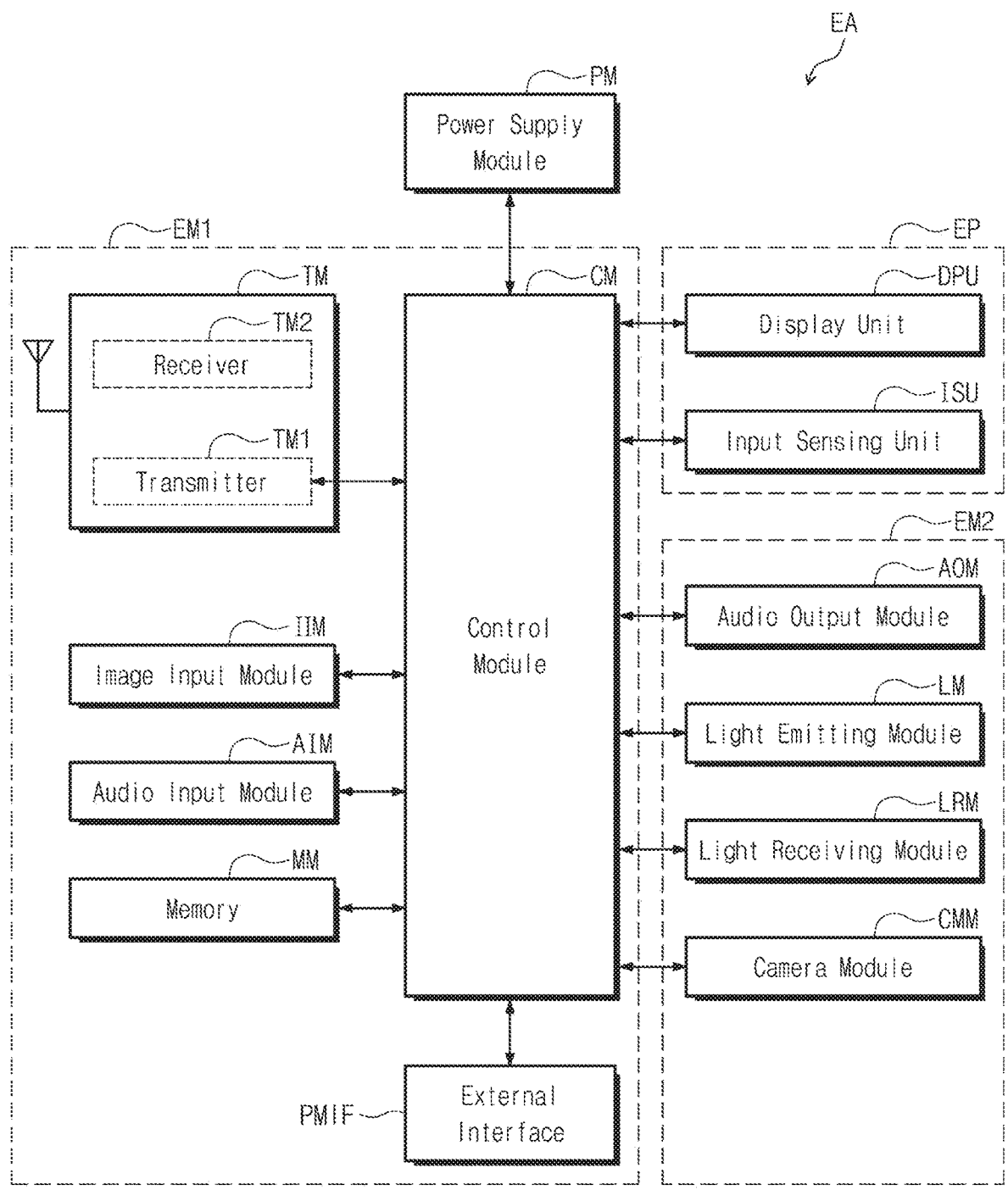
FIG. 3 is a block diagram of the display apparatus of FIG. 1.

FIG. 1 is a perspective view of a display apparatus according to an exemplary embodiment of the inventive concept. FIG. 2 is an exploded perspective view of the display apparatus of FIG. 1. FIG. 3 is a block diagram of the display apparatus of FIG. 1. Hereinafter, a display apparatus according to an exemplary embodiment of the inventive concept will be described with reference to FIGS. 1 to 3.

A display apparatus EA may be an apparatus that is activated according to an electrical signal. For example, the display apparatus EA may include a tablet, a notebook, a computer, a smart television, and the like. In this exemplary embodiment, the display apparatus EA including a smart phone will be described as an example.

As illustrated in FIG. 1, the display apparatus EA may display an image IM on a front surface thereof. The front surface may be defined in parallel to a surface defined by a first direction DR1 and a second direction DR2. The front surface may include a transmission area TA and a bezel area BZA adjacent to the transmission area TA.

The image IM is displayed on the transmission area TA of the display apparatus EA. FIG. 1A illustrates an Internet search window as an example of the image IM. The transmission area TA may have a rectangular shape that is parallel to the first direction DR1 and the second direction DR2. However, this is merely an example, and the display apparatus EA may have various shapes and is not limited to a specific embodiment.

The bezel area BZA is adjacent to the transmission area TA. The bezel area BZA may surround the transmission area TA. However, this is merely an example. The bezel area BZA may be disposed adjacent to only one side of the transmission area TA or be omitted entirely. The display apparatus according to the inventive concept may include various exemplary embodiments, and is not limited to a specific exemplary embodiment.

A normal direction of the front surface may correspond to a thickness direction (hereinafter, referred to as a third direction) of the display apparatus EA. In this exemplary embodiment, a front surface (or a top surface) or a rear surface (or a bottom surface) of each of the members may be defined with respect to a direction in which the image IM is displayed. The front and rear surfaces may face each other in the third direction DR3.

The directions indicated as the first to third direction DR1, DR2, and DR3 may be a relative concept and thus changed into different directions. Hereinafter, the first to third directions may be directions indicated by the first to third direction DR1, DR2, and DR3 and designated by the same reference numerals, respectively.

The display apparatus EA according to the inventive concept may sense a user's input TC applied from the outside. The user's input TC includes various types of external inputs such as a portion of user's body, light, heat, a pressure, or the like. In this exemplary embodiment, the user's input TC is illustrated as a user's hand applied to the front surface. However, this is merely an example. For example, as described above, the user's input TC may have various shapes. The display apparatus EA may sense the user's input TC applied to a side surface or the rear surface of the display apparatus EA according to a structure of the display apparatus EA, but the inventive concept is not so limited.

Figure 4:
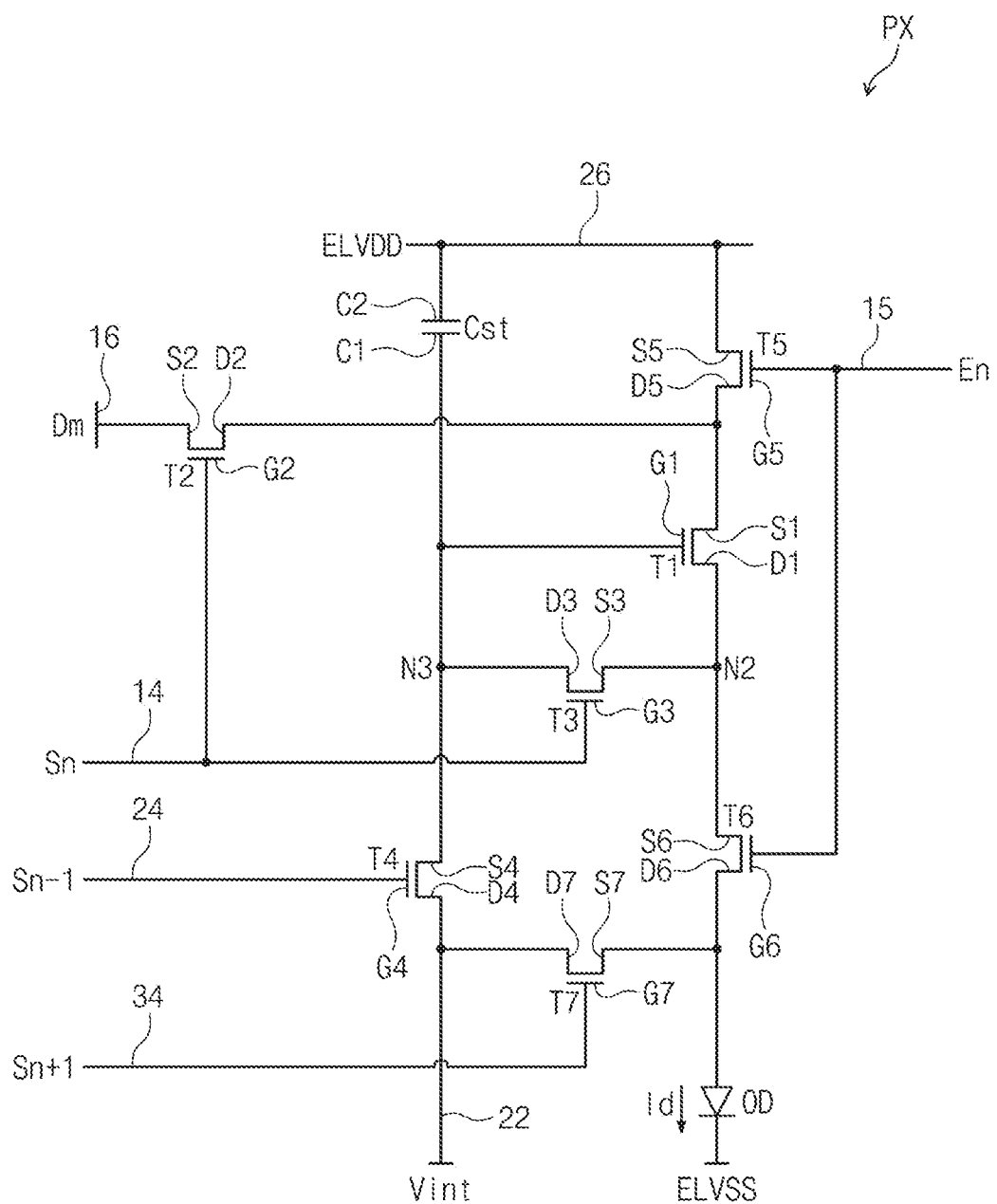
FIG. 4 is an equivalent circuit diagram illustrating a pixel of a display panel of an exemplary embodiment of the inventive concept.

As illustrated in FIGS. 1 and 2, the display apparatus EA includes a display panel EP, a window member WM, an electronic module EM, and an accommodation member BM. As illustrated in FIG. 3, the display apparatus EA may further include a first electronic module EM1, a second electronic module EM2, and a power supply module PM in addition to the display panel EP. In FIG. 2, portions of the constituents of FIG. 4 are omitted. Hereinafter, the display apparatus EA will be described with reference to FIGS. 1 to 3.

The display panel EP may display the image IM and sense the external input TC. For example, the display panel EP may include a display unit DPU displaying the image IM and an input sensing unit ISU sensing the external input TC.

In this exemplary embodiment, the input sensing unit ISU may sense an input applied to the window member WM.

The display panel EP may include an active area AA, a peripheral area NAA, and a hole area HA, which are divided on a plane. The active area AA may be an area that is activated according to an electrical signal.

In this exemplary embodiment, the active area AA may be an area on which the image is displayed, and also, the external input TC is sensed. However, this is merely an example. For example, an area of the active area AA, on which the image IM is displayed, and an area of the active area AA, on which the external input TC is sensed, may be separated from each other, and the inventive concept is not limited to a specific embodiment.

The peripheral area NAA may be an area covered by the bezel area BZA. The peripheral area NAA is adjacent to the active area AA. The peripheral area NAA may surround the active area AA. A driving circuit or a driving line for driving the active area AA may be disposed on the peripheral area NAA.

In this exemplary embodiment, the display panel EP may be assembled in a state in which the active area AA and the peripheral area NAA are flat to face the window member WM. However, this is merely an example. For example, a portion of the peripheral area NAA of the display panel EP may be bent. Here, a portion of the peripheral area NAA may be disposed to face a rear surface of the display apparatus EA to reduce an area of the bezel BZA on the front surface of the display apparatus EA. Alternatively, the display panel EP may be assembled in a state in which a portion of the active area AA is bent. Alternatively, in the display panel EP according to the inventive concept, the peripheral area NAA may be omitted.

An edge of the hole area HA may be surrounded by the active area AA. The hole area HA may be spaced apart from the peripheral area NAA with the active area AA therebetween on the plane.

The hole area HA may be an area in which a module hole MI-1 is defined and a portion of a peripheral area of the area in which the module hole MH is defined. Thus, the module hole MH may be surrounded by the active area AA, on which the image IM is displayed, on the plane.

At least one module hole MH passing through the display panel EP in the third direction DR3 may be defined in the display panel EP according to an exemplary embodiment of the inventive concept. The module hole MH may be a through-hole connected from the front surface to the rear surface of the display panel EP. A constituent disposed on the rear surface of the display panel EP to overlap the module hole MH may be visible through the module hole MH at the front surface of the display panel EP. In this embodiment, although the module hole MH has a cylindrical shape having a height in the third direction DR3, the embodiment of the inventive concept is not limited thereto. For example, the module hole MH may have a polygonal column shape, an oval column shape, a cone shape, and the like, and is not limited to a specific embodiment.

The module hole MH overlaps the electronic module EM on the plane. The electronic module EM may receive an external input through the module hole MH. The electronic module EM may receive a signal inputted through the module hole MH to provide the signal to the display panel EP. The electronic module EM may be a module having a size that is enough to be accommodated in the module hole MH or having a size that is similar to that of at least the module hole MH. The electronic module EM will be described below in more detail.

The window member WM is disposed on the front surface of the display apparatus EA. The window member WM may be disposed on the front surface of the display panel EP to protect the display panel EP. For example, the window member WM may include a glass substrate, a sapphire substrate, or a plastic film. The window member WM may have a single layer or multilayered structure. For example, the window member WM may have a laminated structure of a plurality of plastic films bonded to each other by using an adhesive or a laminated structure of a glass substrate and a plastic film, which are bonded to each other by using an adhesive.

The window member WM may be divided into the transmission area TA and the bezel area BZA. The transmission area TA may be an area through which incident light is transmitted. The transmission area TA may have a shape corresponding to that of the active area AA. For example, the transmission area TA overlaps an entire surface of at least a portion of the active area AA. The image IM displayed on the active area AA of the display panel EP may be visible through the transmission area TA from the outside.

The bezel area BZA may be an area having light transmittance that is relatively less than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover the peripheral area NAA of the display panel EP to prevent the peripheral area NAA from being visible from the outside. However, this is merely an example. For example, in the window member WM according to the inventive concept, the bezel area BZA may be omitted.

The accommodation member BM may be coupled to the window member WM. The accommodation member BM may be provided on the rear surface of the display apparatus EA. The accommodation member BM be coupled to the window member WM to define an inner space.

The accommodation member BM may include a material having relatively high rigidity. For example, the accommodation member BM may include a plurality of frames and/or plates, which are made of glass, plastic, and metal. The accommodation member BM may stably protect the constituents of the display apparatus EA, which are accommodated in the inner space, against an external impact. The display panel EP and the various constituents of FIG. 3 may be accommodated in the inner space provided by the accommodation member BM.

Referring to FIG. 3, the display apparatus EA may include a power supply module PM, a first electronic module EM1, and a second electronic module EM2. The power supply module PM supplies power required for an overall operation of the display apparatus EA. The power supply module PM may include a general battery module.

The first electronic module EM1 and the second electronic module EM2 may include various functional modules for driving the display apparatus EA. The first electronic module EM1 may be directly mounted on a mother board electrically connected to the display panel EP or may be mounted on a separate board and electrically connected to the mother board through a connector (not shown).

The first electronic module EM1 may include a control module CM, a wireless communication module TM, an image input module IIM, an audio input module AIM, a memory MM, and an external interface PMIF. A portion of the modules may not be mounted on the mother board but electrically connected to the mother board through a flexible circuit board.

The control module CM controls the overall operation of the display apparatus EA. The control module CM may be a microprocessor. For example, the control module CM may activate or deactivate the display panel EP. The control module CM may control other modules such as the image input module IIM or the audio input module AIM on the basis of a touch signal received from the display panel EP.

The wireless communication module TM may transmit/receive a wireless signal to/from the other terminal by using Bluetooth or Wi-Fi line. The wireless communication module TM may transmit/receive an audio signal by using a general communication line. The wireless communication module TM includes a transmitter TM1 modulating and transmitting a signal to be transmitted and a receiver TM2 demodulating the received signal.

The image input module IIM processes the image signal to convert the processed image signal into image data that is capable of being displayed on the display panel EP. The audio input module AIM receives external audio signals by using a microphone during recording mode or a voice recognition mode to convert the received audio signal into electrical sound data.

The external interface PMIF serves as an interface connected to an external charger, a wired/wireless data port, and a card socket (for example, a memory card and an SIM/UIM card).

The second electronic module EM2 may include an audio output module AOM, a light emitting module LM, a light receiving module LRM, and a camera module CMM. The above-described constituents may be directly mounted on the mother board, may be mounted on a separate board and electrically connected to the display panel EP through a connector (not shown), or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include an LED. The light receiving module LRM may sense the infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external object (for example, a user's finger or face), and the reflected infrared rays may be incident into the light receiving module LRM. The camera module CMM photographs an external image.

The electronic module EM of FIG. 2 may receive the external input transmitted through the module hole MH or provide an output through the module hole MH. The electronic module EM may be one of the modules constituting the first electronic module EM1 and the second electronic module EM2. For example, the electronic module EM may be a camera, a speaker, or a sensor that senses light or heat. The electronic module EM may sense an external object received through the module hole MH or provide a sound signal such as voice to the outside through the module hole MH. Here, the remaining constituents of the first electronic module EM1 and the second electronic module EM2 may be disposed at different positions and thus, may not be illustrated. However, this is merely an example. The first electronic module EM may include a plurality of modules constituting the first electronic module EM1 and the second electronic module EM2, but is not limited to a specific exemplary embodiment. Although not shown, the display apparatus EA according to the inventive concept may further include a transparent member disposed between the electronic module EM and the display panel EP. The transparent member may be an optically transparent film so that the external input transmitted through the module hole MH passes through the transparent member and is transmitted to the electronic module EM. The transparent member may be attached to the rear surface of the display panel EP or be disposed between the display panel EP and the electronic module EM without an adhesion layer. The display apparatus EA according to the inventive concept may have various shapes, and is not limited to a specific exemplary embodiment.

In the inventive concept, the display panel EP may include the module hole MH. Thus, a separate space provided from the electronic module EM outside the peripheral area NAA may be omitted. Also, the module hole MH may be defined in a hole area HA surrounded by the active area AA so that the electronic module EM is disposed to overlap the transmission area TA, but not the bezel area BZA. Thus, the bezel area BZA may be reduced in area to realize an display apparatus EA having a narrow bezel. Also, when the electronic module EM is accommodated in the module hole MH, a compact display apparatus EA may be realized.

FIG. 4 is an equivalent circuit diagram illustrating a pixel PX of the display panel.

Referring to FIG. 4, one pixel PX according to an exemplary embodiment of the inventive concept may include a plurality of transistor T1 to T7, a storage capacitor Cst, and a light emitting element (e.g., an organic light emitting diode OD).

According to the inventive concept, the remaining constituents of the pixel PX except for the light emitting element OD, i.e., the plurality of transistors T1 to T7 and the storage capacitor Cst, may be defined as driving elements.

The thin film transistors T1 to T7 include a driving transistor T1, a switching transistor T2, a compensation transistor T3, an initialization transistor T4, a first light emitting control transistor T5, a second light emitting control transistor T6, and a bypass transistor T7.

The pixel PX includes a first gate line 14 transmitting an n-th scan signal Sn to the switching transistor T2 and the compensation transistor T3, a second gate line 24 transmitting an (n−1)-th scan signal Sn−1 to the initialization transistor T4, a third gate line 34 transmitting an (n+1)-th scan signal Sn+1 to the bypass transistor T7, a light emitting line 15 transmitting a light emitting control signal Sn to the first light emitting control transistor T5 and the second light emitting control transistor T6, a data line 16 transmitting a data signal Dm, a power line 26 transmitting a power source voltage ELVDD, and an initialization voltage line 22 transmitting an initialization voltage Vint by which the driving transistor T1 is initialized.

A gate electrode G1 of the driving transistor T1 is connected to a first electrode C1 of the storage capacitor Cst. A source electrode S1 of the driving transistor T1 is connected to the power line 26 via the first light emitting control transistor T5. A drain electrode D1 of the driving transistor T1 is electrically connected to an anode of the light emitting element OD via the second light emitting control transistor T6. The driving transistor T1 receives the data signal Dm according to a switching operation of the switching transistor T2 to supply driving current Id to the light emitting element OD.

A gate electrode G2 of the switching transistor T2 is connected to the first gate line 14. The source electrode S2 of the switching transistor T2 is connected to the data line 16. A driving electrode D2 of the switching transistor T2 is connected to the source electrode S1 of the driving transistor T1 and then connected to the power line 26 via the first light emitting control transistor T5. The switching transistor T2 is turned on according to a first scan signal Sn received through the first gate line 14 to perform the switching operation for transmitting the data signal Dm, which is transmitted to the data line 16, to the source electrode S1 of the driving transistor T1.

A gate electrode G3 of the compensation transistor T3 is connected to the first gate line 14. The source electrode S3 of the compensation transistor T3 is connected to the drain electrode D1 of the driving transistor T1 and then connected to the anode of the light emitting element OD via the second light emitting control transistor T6. A drain electrode D3 of the compensation transistor T3 is connected to the first electrode C1 of the storage capacitor Cst, a source electrode S4 of the initialization transistor T4, and the gate electrode G1 of the driving transistor T1. The compensation transistor T3 is turned on according to the n-th scan signal Sn transmitted through the first gate line 14 to connect the gate electrode G1 and the drain electrode D1 of the driving transistor T1 to each other so that the driving transistor T1 is diode-connected.

A gate electrode G4 of the initialization transistor T4 is connected to the second gate line 24. A drain electrode D4 of the initialization transistor T4 is connected to the initialization voltage line 22. The source electrode S4 of the initialization transistor T4 is connected to the first electrode C1 of the storage capacitor Cst, a drain electrode D3 of the compensation transistor T3, and the gate electrode G1 of the driving transistor T1. The initialization transistor T4 is turned on according to the (n−1)-th scan signal Sn−1 transmitted through the second gate line 24 to transmit the initialization voltage Vint to the gate electrode G1 of the driving transistor T1, thereby initializing a voltage of the gate electrode G1 of the driving transistor T1.

A gate electrode G5 of the first light emitting control transistor T5 is connected to the light emitting line 15. The first light emitting control transistor T5 may be connected between the power line 26 and the driving transistor T1. The source electrode S5 of the first light emitting control transistor T5 is connected to the power line 26. A drain electrode D5 of the first light emitting control transistor T5 is connected to the source electrode S1 of the driving transistor T1 and the drain electrode D2 of the switching transistor T2. When a light emitting control signal En is applied to the gate electrode G5 of the first light emitting control transistor T5, the first light emitting control transistor T5 is turned on so that the driving current Id flows through the light emitting element OD. The light emitting control transistor T5 may determine timing at which driving current Id flows to the light emitting element OD.

A gate electrode G6 of the second light emitting transistor T6 is connected to the light emitting line 15. The second light emitting control transistor T6 may be connected between the driving transistor T1 and the light emitting element OD. The source electrode S6 of the second light emitting control transistor T6 is connected to the drain electrode D1 of the driving transistor T1 and the source electrode S3 of the compensation transistor T3. A drain electrode D6 of the second light emitting control transistor T6 is electrically connected to the anode of the light emitting element OD. The first light emitting control transistor T5 and the second light emitting control transistor T6 are turned on according to the light emitting control signal En transmitted through the light emitting line 15. As the light emitting control signal En is applied to the gate electrode G6 of the second light emitting control transistor T6, the second light emitting control transistor T6 is turned on so that the driving current Id flows through the light emitting element OD. The second light emitting control transistor T6 may determine timing at which driving current Id flows to the light emitting element OD.

A gate electrode G7 of the bypass transistor T7 is connected to the third gate line 34. The source electrode S7 of the bypass transistor T7 is connected to the anode of the light emitting element OD. A drain electrode D7 of the bypass transistor T7 is connected to the initialization voltage line 22. The bypass transistor T7 is turned on according to the (n+1)-th scan signal Sn+1 transmitted through the third gate line 34 to initialize the anode of the light emitting element OD.

The second electrode C2 of the storage capacitor Cst is connected to the power line 26. The first electrode C1 of the storage capacitor Cst is connected to the gate electrode G1 of the driving transistor T1, the drain electrode D3 of the compensation transistor T3, and the source electrode S4 of the initialization transistor T4.

The cathode of the light emitting element OD receives a reference voltage ELVSS. The light emitting element OD receives the driving current Id from the driving transistor T1 to emit light. The light emitting element OD includes a luminescent material. The light emitting element OD may generate light having a color corresponding to the luminescent material. The color of the light generated in the light emitting element OD may have one of a red color, a green color, a blue color, and a white color.

According to another exemplary embodiment of the inventive concept, the number and the connection relationship of the transistors T1 to T7 constituting the pixel PX may be variously changed.

Figure 5:
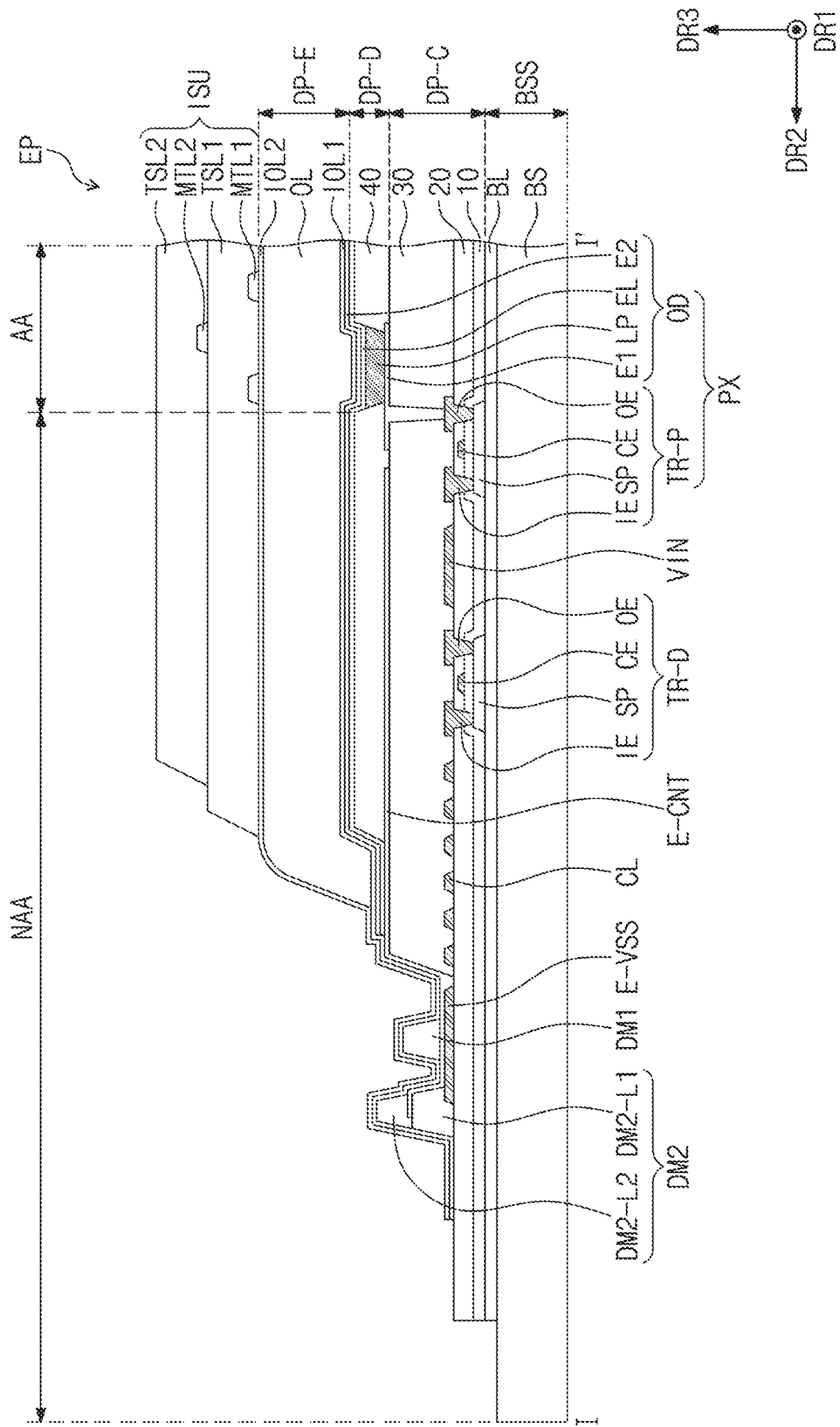
FIG. 5 is a cross-sectional view taken along line I-I' of FIG. 2.

FIG. 5 is a cross-sectional view taken along line I-I' of FIG. 2.

Referring to FIG. 5, the display panel EP may include a base substrate BSS, a circuit layer DP-C, a display element layer DP-D, an encapsulation layer DP-E, and an input sensing unit ISU. The circuit layer DP-C and the display element layer DP-D may include the constituents of the pixel PX described with reference to FIG. 4.

The pixel PX may be disposed on the active area AA. The pixel PX may generate light to realize the above-described image IM. The pixel PX may be provided in plurality and arranged on the active area AA.

FIG. 5 illustrates an example of one thin film transistor TR-P (hereinafter, referred to as a pixel transistor) and one light emitting element OD of the constituents of the pixel PX. The pixel transistor TR-P may correspond to the driving transistor T1 of FIG. 4.

The pixel transistor TR-P together with first to third insulation layers 10, 20, and 30 of a plurality of insulation layers may constitute the circuit layer DP-C. Each of the first to third insulation layers 10, 20, and 30 may include an organic material and/or an inorganic material and have a single layer or multilayered structure. The circuit layer DP-C is disposed on the base substrate BSS.

The base substrate BSS includes a base layer BS and an auxiliary layer BL. The base layer BS may be an insulation substrate. The base layer BS may be provided in a flexible state. For example, the base layer BS may include polyimide (PI). Alternatively, the base layer BS may be provided in a rigid state. For example, the base layer BS may be made of various materials, such as glass, plastic, and the like, but the inventive concept is not so limited.

The auxiliary layer BL is disposed on the base layer BS. The auxiliary layer BL may be directly disposed on the base layer BS to cover the front surface of the base layer BS. Thus, a front surface of the auxiliary layer BL may be provided as the front surface SS of the base substrate BSS, and a rear surface of the base layer BS may be provided as the rear surface of the base substrate BSS.

The auxiliary layer BL includes an inorganic material. The auxiliary layer BL may include a barrier layer and/or a buffer layer. Thus, the auxiliary layer BL may prevent oxygen or moisture introduced through the base layer BS from being permeated into the circuit layer DP-C or the display element layer DP-D or may reduce surface energy of the base substrate BSS so that the circuit layer DP-C is stably formed on the base substrate BSS.

In the base substrate BSS, at least one of the base layer BS and the auxiliary layer BL may be provided in plurality and be alternately laminated. Alternatively, at least one of the barrier layer and the buffer layer constituting the auxiliary layer BL may be provided in plurality, or may be entirely omitted. However, this is merely an example, and the inventive concept is not so limited. For example, the base substrate BSS according to the inventive concept may be realized according to various exemplary embodiments, and is not limited to any one specific exemplary embodiment.

The pixel transistor TR-P includes a semiconductor pattern SP, a control electrode CE, an input electrode IE, and an output electrode OE. The semiconductor pattern SP is disposed on the base substrate BSS. The semiconductor pattern SP may include a semiconductor material. The control electrode CE is spaced apart from the semiconductor pattern SP with a first insulation layer 10 therebetween. The control electrode CE may be connected to one electrode of each of the first thin film transistor TR1 and the capacitor CAP, which are described above.

The input electrode IE and the output electrode OE may be spaced apart from the control electrode CE with the second insulation layer therebetween. The input electrode IE and the output electrode OE of the pixel transistor TR-P may be connected to one side and the other side of the semiconductor pattern SP by passing through the first insulation layer 10 and the second insulation layer 20, respectively.

The third insulation layer 30 may be disposed on the second insulation layer to cover the input electrode IE and the output electrode OE. In the pixel transistor TR-P, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer and be directly connected to the semiconductor pattern SP. The pixel transistor TR-P according to the inventive concept may have various structures, but is not limited to any one specific exemplary embodiment.

The light emitting element OD is disposed on the circuit layer DP-C. The light emitting element may constitute the display element layer DP-D together with the fourth insulation layer 40 of the plurality of insulation layers. The light emitting element OD includes a first electrode E1, a light emitting pattern LP, a control layer EL, and a second electrode E2. The fourth insulation layer 40 may include an organic material and/or an inorganic material and have a single layer or multilayered structure.

The first electrode E1 may be connected to the pixel transistor TR-P by passing through the third insulation layer 30. Although not shown, the display panel 100 may further include a separate connection electrode disposed between the first electrode E1 and the pixel transistor TR-P. Here, the first electrode E1 may be electrically connected to the pixel transistor TR-P through the connection electrode.

The fourth insulation layer 40 is disposed on the third insulation layer 30. An opening may be defined in the fourth insulation layer 40. The opening may expose at least a portion of the first electrode E1. The fourth insulation layer 40 may be a pixel defining layer.

The light emitting pattern LP may be disposed on the opening and disposed on the first electrode E1 exposed by the opening. The light emitting pattern LP may include a luminescent material. For example, the light emitting pattern LP may be made of at least one of several materials that emit light having red, green, and blue colors and include fluorescent material or a phosphorescent material. The light emitting pattern LP may include an organic luminescent material and an inorganic luminescent material. The light emitting pattern LP may emit light in response to a difference in potential between the first electrode E1 and the second electrode E2.

The control layer EL is disposed between the first electrode E1 and the second electrode E2. The control layer EL is disposed adjacent to the light emitting pattern LP. The control layer EL controls movement of the charges to improve luminous efficiency and lifetime of the light emitting element OD. The control layer EL may include at least one of hole transport material, a hole injection material, an electron transport material, and an electron injection material.

In this exemplary embodiment, the control layer EL may be disposed between the light emitting pattern LP and the second electrode E2. However, this is merely an example. The control layer EL may instead be disposed between the light emitting pattern LP and the first electrode E1 and may be provided as a plurality of layers that are laminated in the third direction DR3 with the light emitting pattern LP therebetween.

The control layer EL may have an integrated shape that extends from the active area AA to the peripheral area NAA. The control layer EL may be commonly provided to the plurality of pixels.

The second electrode E2 is disposed on the light emitting pattern LP. The second electrode E2 may face the first electrode E1. The second electrode E2 may have an integrated shape that extends from the active area AA to the peripheral area NAA. The second electrode E2 may be commonly provided to the plurality of pixels. The light emitting element OD disposed on each of the pixels may receive a common power voltage (hereinafter, referred to as a second power voltage) through the second electrode E2.

The second electrode E2 may include a transmissive conductive material or a transflective conductive material. Thus, the light generated in the light emitting pattern LP may be easily emitted in the third direction DR3 through the second electrode E2. However, this is merely an example. The light emitting element OD according to the inventive concept may be driven in a bottom emission manner including a transmissive or semi-transmissive material or may be driven in a double-side emission manner in which light is emitted from all of the front and rear surfaces, but the inventive concept is not limited to a any one specific embodiment.

The encapsulation layer DP-E may be disposed on the light emitting element OD to encapsulate the light emitting element OD. The encapsulation layer DP-E may have an integrated shape that extends from the active area AA to the peripheral area NAA. The encapsulation layer DP-E may be commonly provided to the plurality of pixels. Although not shown, a capping layer covering the second electrode E2 may be further disposed between the second electrode E2 and the encapsulation layer DP-E.

The encapsulation layer DP-E may include a first inorganic layer IOL1, an organic layer OL, and a second inorganic layer IOL2, which are sequentially laminated in the third direction DR3. However, the inventive concept is not limited thereto. For example, the encapsulation layer DP-E may further include a plurality of inorganic layers and organic layers.

The first inorganic layer IOL1 may cover the second electrode E2. The first inorganic layer IOL1 may prevent external moisture or oxygen from being permeated into the light emitting element OD. For example, the first inorganic layer IOL1 may include silicon nitride, silicon oxide, or a combination thereof. The first inorganic layer IOL1 may be formed through a deposition process.

The organic layer OL may be disposed on the first inorganic layer IOL1 to contact the first inorganic layer IOL1. The organic layer OL may provide a flat surface on the first inorganic layer IOL1. A curve formed on a top surface of the first inorganic layer IOL1 or particles existing on the first inorganic layer IOL1 may be covered by the organic layer OL to prevent the surface state of the top surface of the first inorganic layer IOL1 from having an influence on the constituents disposed on the organic layer OL. Also, the organic layer OL may function to reduce stress between the layers contacting each other. The organic layer OL may include an organic material and be formed through a solution process such as spin coating, slit coating, inkjet process, and the like.

The second inorganic layer IOL2 may be disposed on the organic layer OL to cover the organic layer OL. The second inorganic layer IOL2 may be relatively stably formed on the flat surface when compared to the second inorganic layer IOL2 disposed on the first inorganic layer IOL1. The second inorganic layer IOL2 may encapsulate moisture discharged from the organic layer OL to prevent the moisture from being introduced. The second inorganic layer IOL2 may include silicon nitride, silicon oxide, or a combination thereof. The second inorganic layer IOL2 may be formed through a deposition process.

The input sensing unit ISU may include a conductive layer MTL1, a second conductive layer MTL2, a first touch insulation layer TSL1, and a second touch insulation layer TSL2.

The first conductive layer MTL1 may be disposed on the encapsulation layer DP-E.

The first conductive layer MTL1 may include a conductive material. For example, the first conductive layer MTL1 may include at least one of a metal, a transparent conductive oxide, or a conductive polymer. The first conductive layer MTL1 may be provided as a plurality of layers, but it not limited thereto.

The first touch insulation layer TSL1 may be disposed on the first conductive layer MTL1 to cover the first conductive layer MTL1.

The second conductive layer MTL2 may be disposed on the first touch insulation layer TSL1. For example, the second conductive layer MTL2 may include at least one of a metal, a transparent conductive oxide, or a conductive polymer. The second conductive layer MTL2 may be provided as a plurality of layers, but is not limited thereto.

In this exemplary embodiment, the second conductive layer MTL2 may be electrically connected to the first conductive layer MTL1 through a contact hole (not shown) passing through the first touch insulation layer TSL1 in a partial area thereof. A touch line configuration of the input sensing unit ISU, which is formed by using the first conductive layer MTL1 and the second conductive layer MTL2, will be described later.

The second touch insulation layer TSL2 may be disposed on the second conductive layer MTL2 to cover the second conductive layer MTL2.

The display panel EP according to an exemplary embodiment of the inventive concept may further include a thin film transistor TR-D (hereinafter, referred to as a driving transistor) disposed on the peripheral area NAA, a plurality of signal patterns E-VSS, E-CNT, VIN, and CL, and a plurality of dam parts DM1 and DM2. The control transistor TR-D and the signal patterns E-VSS, E-CNT, VIN, and CL may constitute the circuit layer DP-C.

The control transistor TR-D having a structure corresponding to the pixel transistor TR-P is illustrated as an example. For example, the control transistor TR-D may include a semiconductor pattern SP disposed on the base substrate BSS, a control electrode CE disposed on the first insulation layer 10, an input electrode IE disposed on the second insulation layer 20, and an output electrode OE. Thus, the pixel transistor TR-P and the control transistor TR-D may be formed through the same process at the same time, and thus, the process may be simplified, and the process cost may be reduced. However, this is merely an example. The control transistor TR-D according to an exemplary embodiment of the inventive concept may have a structure different from that of the pixel transistor TR-P, and is not limited to any one specific exemplary embodiment.

The signal patterns E-VSS, E-CNT, VIN, and CL may include a power supply line E-VSS, a connection electrode E-CNT, an initialization voltage line VIN, and a driving signal line CL. The power supply line E-VSS may correspond to the power terminal of the pixel PX. Thus, the power supply line E-VSS supplies a second power voltage to the light emitting element OD. In this exemplary embodiment, the second power voltages supplied to the pixels PX may be a common voltage with respect to all of the pixels PX.

The power supply line E-VSS may be disposed on the second insulation layer 20 to constitute the circuit layer DP-C. The power supply line E-VSS may be formed through the same process as the input electrode IE or the output electrode OE of the control transistor TR-D. However, this is merely an example. For example, the power supply line E-VSS may be disposed on a layer that is different from that of the input electrode IE and the output electrode OE of the control transistor TR-D and thus, be formed through a separate process, but is not limited to a specific exemplary embodiment.

The connection electrode E-CNT may be disposed on the third insulation layer 30 to constitute the display element layer DP-D. The connection electrode E-CNT is electrically connected to the power supply line E-VSS. The connection electrode E-CNT may extend from a top surface of the third insulation layer 30 to cover a top surface of the power supply line E-VSS exposed from the third insulation layer 30.

The second electrode E2 of the light emitting element OD extends from the active area AA and is connected to the connection electrode E-CNT. The connection electrode E-CNT may receive the second power voltage from the power supply line E-VSS. Thus, the second power voltage may be transmitted to the second electrode E2 through the connection electrode E-CNT and be provided to each of the pixels.

The connection electrode E-CNT may be disposed on the same layer as the first electrode E1 of the light emitting element OD and thus be formed at the same time with the first electrode E1. However, this is merely an example. The connection electrode E-CNT and the first electrode E1 may instead be disposed on layers different from each other.

The driving signal line CL may be provided in plurality and disposed on the second insulation layer 20. The driving signal line CL may be disposed on the peripheral area NAA. The driving signal line CL may be a routing line connected to a pad (not shown) or a line constituting the integrated circuit IC. The driving signal lines CL may be disposed to be spaced apart from each other in the first direction DR to independently transmit electrical signals.

The initialization voltage line VIN may be disposed on the active area AA to provide an initialization voltage to the pixel PX. Although not shown, the initialization voltage line VIN may be provided in plurality to provide the initialization voltage to each of the pixels PX.

The driving signal line CL and the initialization voltage line VIN may be disposed on the same layer and formed through the same process at the same time. However, this is merely an example. The driving signal line CL and the initialization voltage line VIN may instead be independently formed through separate processes, but is the inventive is not limited to any one specific exemplary embodiment.

The dam parts DM1 and DM2 are disposed on the peripheral area NAA. The dam parts DM1 and DM2 may prevent the organic layer OL from overflowing from the active area AA to the outside of the dam parts DM1 and DM2, for example, in the second direction DR2 in FIG. 4 when the organic layer OL of the encapsulation layer TFE 15 formed. The dam parts DM1 and DM2 may be disposed adjacent to at least one side of the active area AA. The dam parts DM1 and DM2 may surround the active area AA on the plane. The dam parts DM1 and DM2 may be provided in plurality and include a first dam part DM1 and a second dam part DM2.

The first dam part DM1 may be disposed relatively closer to the active area AA than the second dam part DM2. The first dam part DM1 may be disposed to overlap the power supply line E-VSS on the plane. In this embodiment, the connection electrode E-CNT may pass between the first dam part DM1 and the power supply line E-VSS on a cross-section.

In this exemplary embodiment, the first dam part DM1 may be made of the same material as the fourth insulation layer 40, and the first dam part DM1 and the fourth insulation layer 40 may be formed at the same time by one mask. Thus, a separate process of forming the first dam part DM1 may not be required, thereby reducing the process cost and simplifying the process.

The second dam part DM2 may be disposed at the outside relative to the first dam part DM1. The second dam part DM2 may be disposed on a position at which a portion of the power supply line E-VSS is covered. In this exemplary embodiment, the second dam part DM2 may have a multi-layered structure including a first layer DM2-L1 and a second layer DM2-L2. For example, the first layer DM2-L1 and the third insulation layer 30 may be formed at the same time, and the second layer DM2-L2 and the fourth insulation layer 40 may be formed at the same time. Thus, even though a separate process is not additionally performed, the second dam part DM2 may be easily formed.

In this exemplary embodiment, the connection electrode E-CNT may be disposed to partially overlap the first layer DM2-L1 of the second dam part DM2. The connection electrode E-CNT may have an end that is inserted between the first layer DM2-L1 and the second layer DM2-L2. However, this is merely an example. The connection electrode E-CNT may not extend up to the second dam part DM2, but the inventive concept is not limited to any one specific exemplary embodiment.

The first inorganic layer IOL1 and the second inorganic layer IOL2 may extend from the active area AA to the outside of the second dam part DM2. The first inorganic layer IOL1 and the second inorganic layer IOL2 may cover the first dam part DM1 and the second dam part DM2. The organic layer OL may be disposed inside the second dam part DM2. However, this is merely an example. A portion of the organic layer OL may instead extend up to an area overlapping the first dam part DM1, but the inventive concept is not limited to any one specific embodiment.

Figure 6:
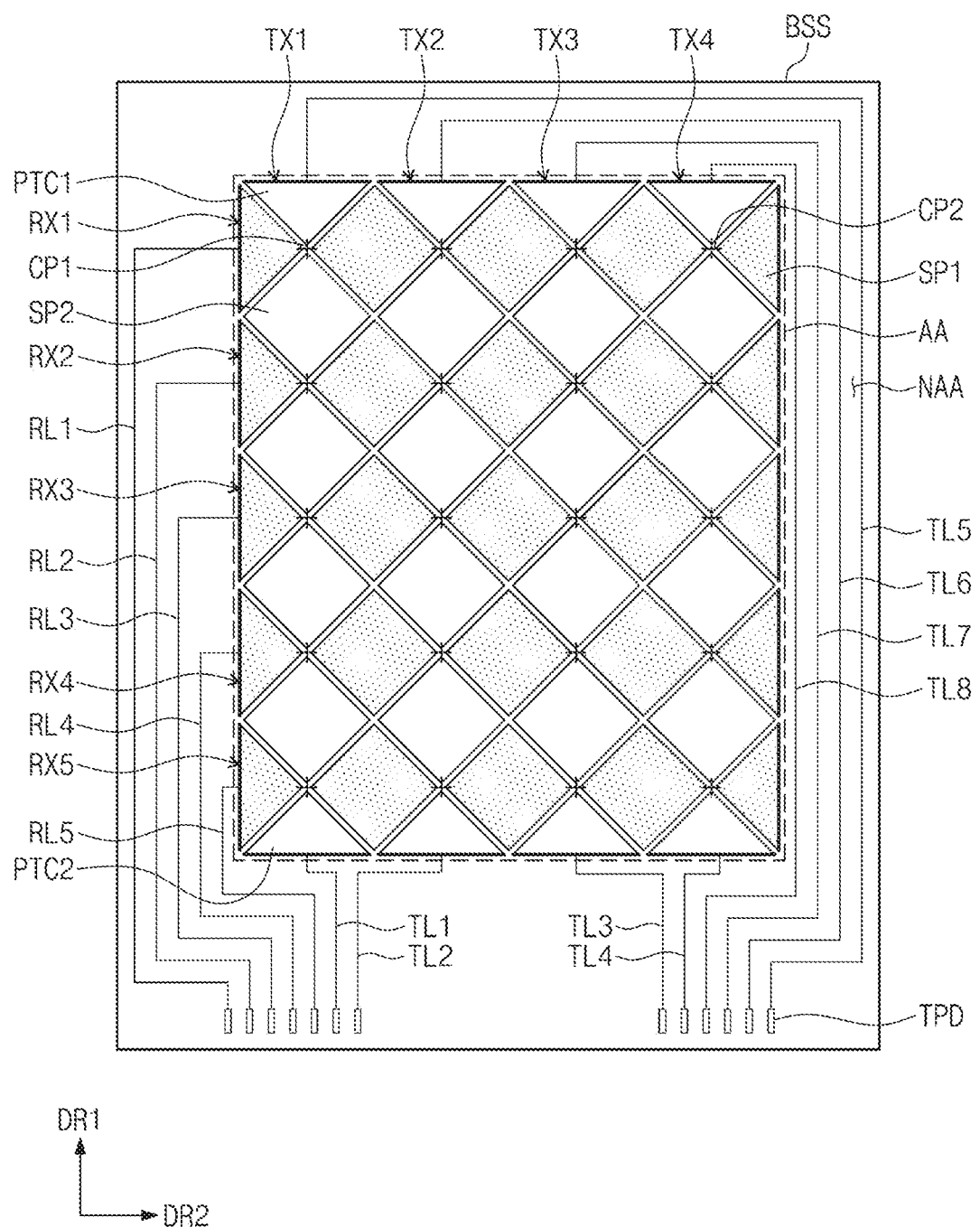
FIG. 6 is a plan view of an input sensing unit and a base substrate of FIG. 4.

FIG. 6 is a plan view of the input sensing unit and the base substrate of FIG. 4.

The input sensing unit ISU may be implemented in a capacitive manner. The input sensing unit ISU may operate through one of a manner of extracting touch coordinates based on a variation in capacitance of a capacitor constituted by two kinds of insulated touch lines extending in different directions and a manner of extracting touch coordinates based on a variation in capacitance of a capacitor constituted by a plurality of touch electrodes with an active area. Hereinafter, a structure in which the input sensing unit ISU operates in an electronic manner will be exemplarily described.

The input sensing unit ISU may sense touch inputted into the active area AA of the touch sensing unit TS, but may not sense touch inputted into the peripheral area NNA.

The input sensing unit ISU may include sensing touch lines RX1 to RX5, transmission touch lines TX1 to TX4, sensing lines RL1 to RL5, transmission line TL1 to TL8, and touch pads TPD.

The sensing touch lines RX1 to RX5 are spaced apart from the transmission touch lines TX1 to TX4.

The transmission touch lines TX1 to TX4 are insulated from and cross the sensing touch lines RX1 to RX5. Each of the transmission touch lines TX1 to TX4 includes a plurality of transmission touch sensing parts SP2 and a plurality of connection parts CP1. The transmission touch sensing parts SP2 are arranged in the first direction DR1. Each of the first connection parts connects two transmission touch sensing parts SP2, which are adjacent to each other, of the transmission touch sensing parts SP2. Although not shown, each of the transmission touch sensing parts SP2 may have a mesh shape having openings therein.

Each of the sensing touch lines RX1 to RX5 includes a plurality of sensing touch sensing parts SP1 and a plurality of second connection parts CP2. The sensing touch sensing parts SP1 are arranged in the second direction DR2. Each of the second connection parts CP2 connects two sensing touch sensing parts SP1, which are adjacent to each other, of the sensing touch sensing parts SP1. Although not shown, each of the sensing touch sensing parts SP1 may have a mesh shape having openings therein.

In an exemplary embodiment of the inventive concept, the sensing touch sensing parts SP1, the second connection parts CP2, and the transmission sensing parts SP2 may be provided in the first conductive layer MTL1 described with reference to FIG. 5, and the first connection parts CP1 may be provided in the second conductive layer MTL2 described with reference to FIG. 5. Here, the first connection parts CP1 may be connected to the transmission touch sensing parts SP2 through a contact hole (not shown) defined in the first touch insulation layer TSL1. However, the inventive concept is not limited thereto. For example, according to another exemplary embodiment of the inventive concept, the sensing touch sensing parts SP1, the second connection parts CP2, and the transmission sensing parts SP2 may be provided in the second conductive layer MTL2 described with reference to FIG. 5, and the first connection parts CP1 may be provided in the first conductive layer MTL1 described with reference to FIG. 5.

The touch sensing lines RX1 to RX5 and the transmission touch lines TX1 to TX4 may constitute a touch capacitor. The input sensing unit ISU may sense touch input coordinates based on a variation in capacitance of the touch capacitor.

Each of the sensing lines RL1 to RL5 may have one end connected to each of the sensing touch lines RX1 to RX5. Each of the sensing lines RL1 to RL5 may have the other end connected to each of the touch pads TPD. The sensing lines RL1 to RL5 may provide sensing signals received from the sensing touch lines RX1 to RX4 through the touch pads TPD to a touch driving chip TIC (not shown).

One end of each of the first to fourth sensing lines RL1 to RL4 of the transmission lines TL1 to TL8 may be connected to one end of each of the transmission touch line TX1 to TX4. Each of the first to fourth sensing lines RL1 to RL4 may have the other end connected to each of the touch pads TPD. One end of each of the fifth to eighth sensing lines RL5 to RL8 of the transmission lines TL1 to TL8 may be connected to the other end of each of the transmission touch line TX1 to TX4. Each of the fifth to eighth sensing lines RL5 to RL8 may have the other end connected to each of the touch pads TPD. Particularly, in the case of the first transmission touch line TX1, a first outer transmission touch sensing part PTC1 provided in the first transmission touch line TX1 and disposed at the outermost side in the first direction DR1 is connected to the fifth transmission line TL5, and a second outer transmission touch sensing part PTC2 provided in the first transmission touch line TX1 and disposed at the outermost side in a direction opposite to the first direction DR1 is connected to the first transmission line TL1.

The transmission lines TL1 to TL8 may provide touch driving signals applied from the touch driving chip through the touch pads TPD to the transmission touch lines TX1 to TX4.

The number of sensing lines RL1 to RL5 may be the same as the sensing touch lines RX1 to RX5, and the number of transmission lines TL1 to TL8 may be greater than that of transmission touch lines TX1 to TX4.

According to an exemplary embodiment of the inventive concept, the display panel EP (see FIG. 4) may have a rectangular shape on the plane. The base substrate BSS may have a long side extending in the first direction DR1 and a short side extending in the second direction DR2.

Each of the transmission touch lines TX1 to TX4 may have a length greater than that of each of the sensing touch lines RX1 to RX5. To solve signal delay due to a difference in resistance value according to a difference in length between each of the transmission touch lines TX1 to TX4 and each of the sensing touch lines RX1 to RX5, the transmission lines TL1 to TL8 may be connected to both ends of each of the transmission touch lines TX1 to TX4, and the sensing lines RL1 to RL5 may be connected to one end of each of the sensing touch lines RX1 to RX5.

Figure 7:
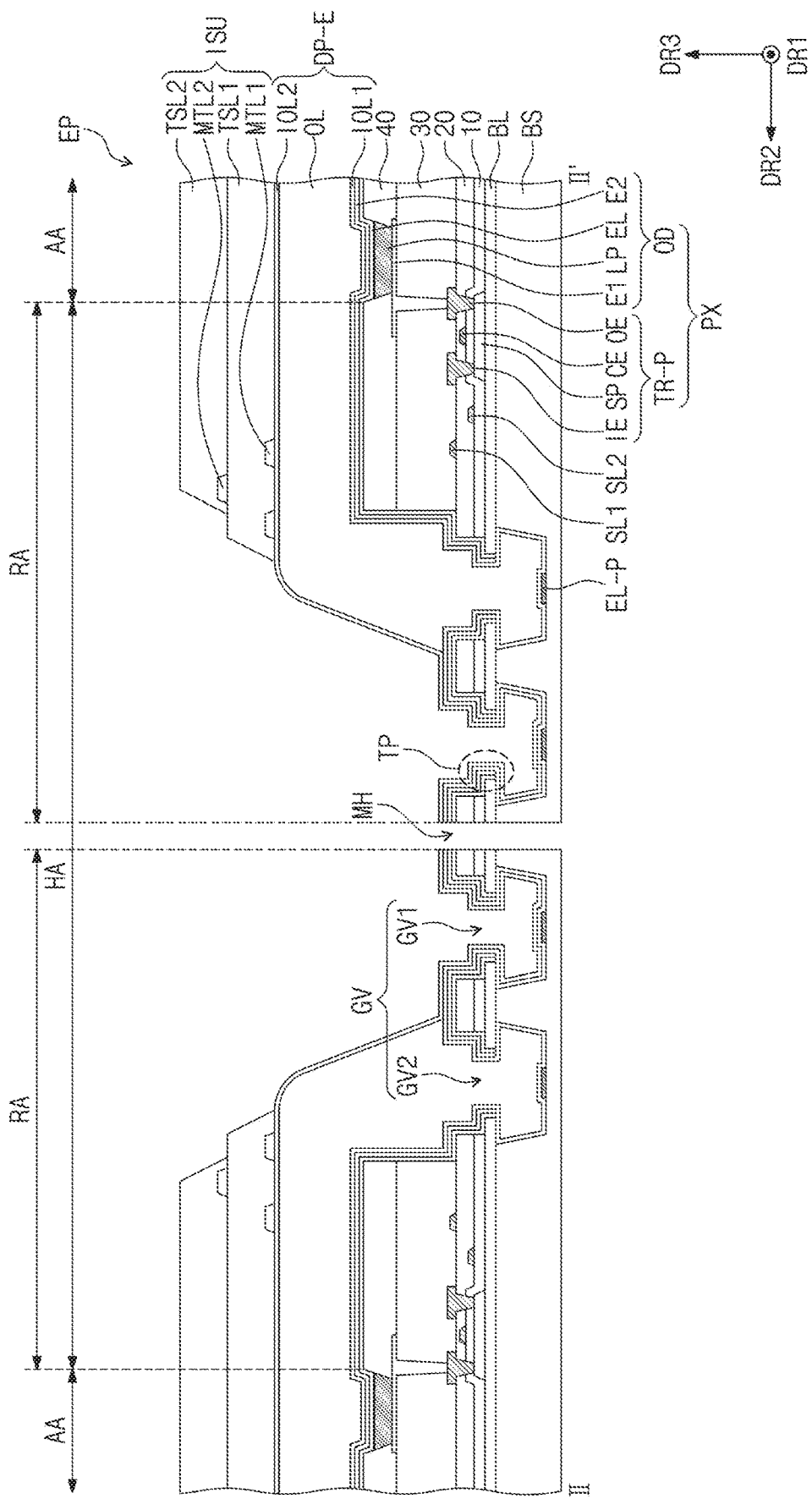
FIG. 7 is a cross-sectional view taken along line II-IF of FIG. 2.
Figure 8:
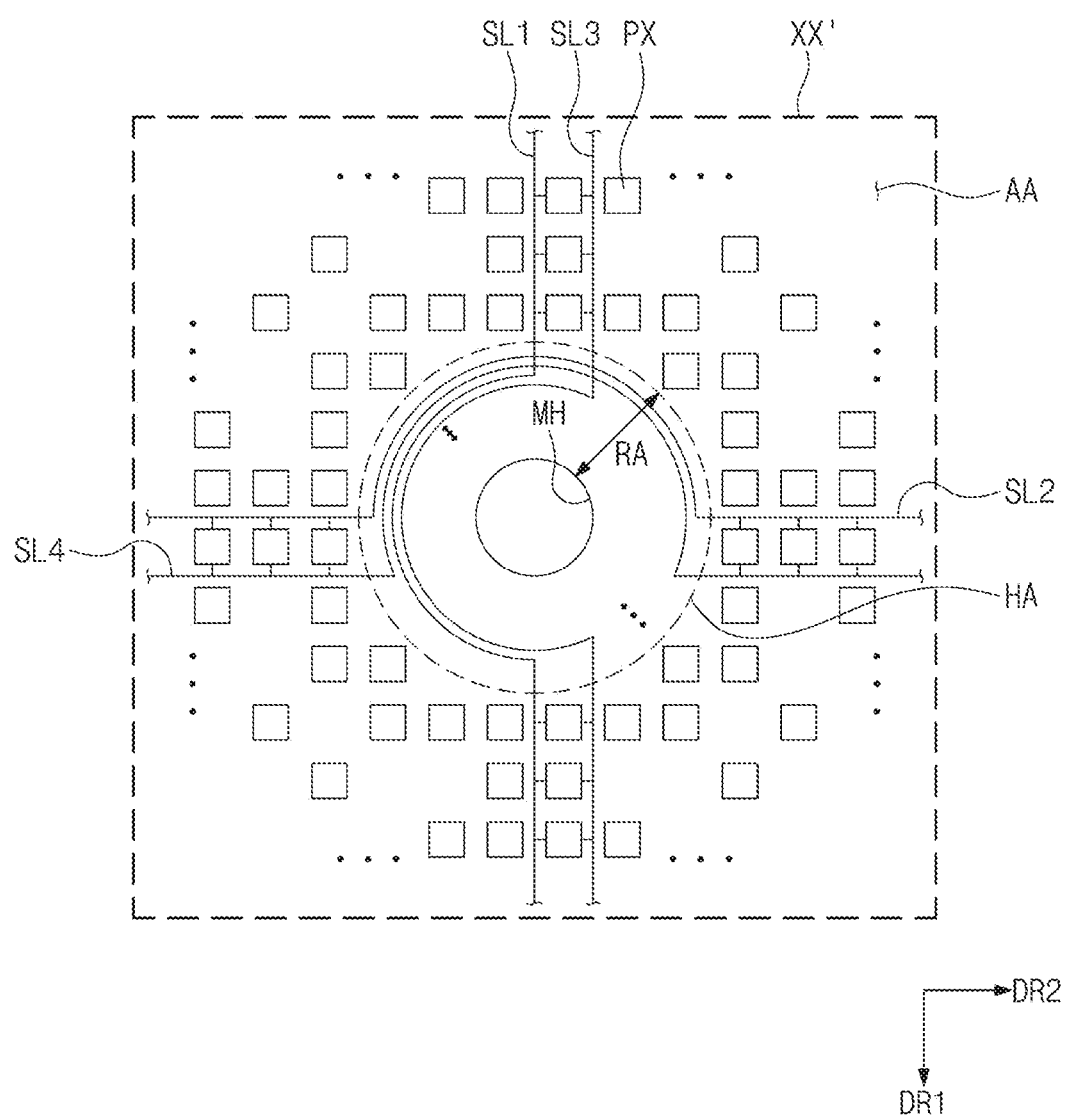
FIGS. 8 and 9 are plan views of an area XX' of FIG. 2.
Figure 9:
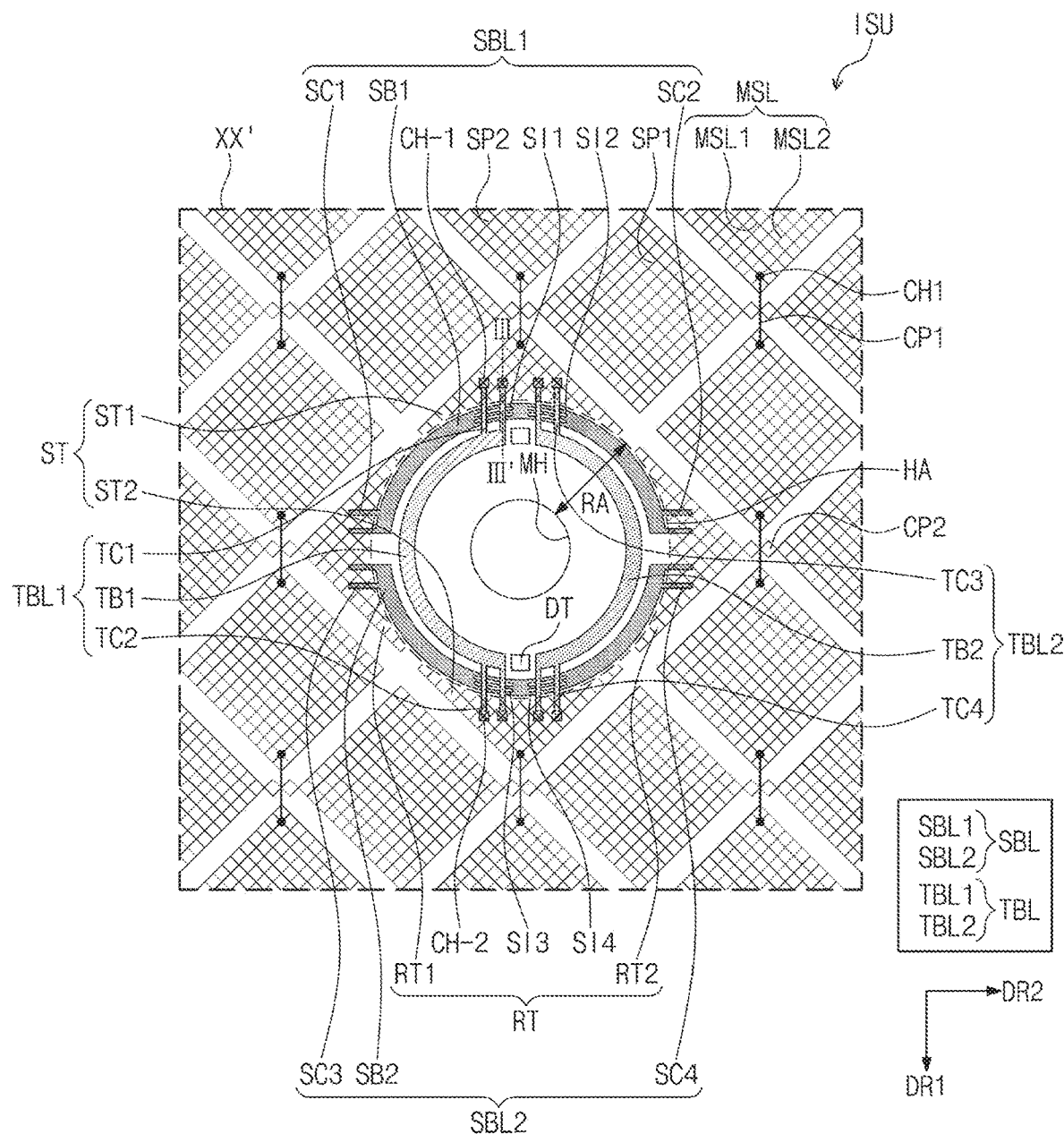
Figure 10:
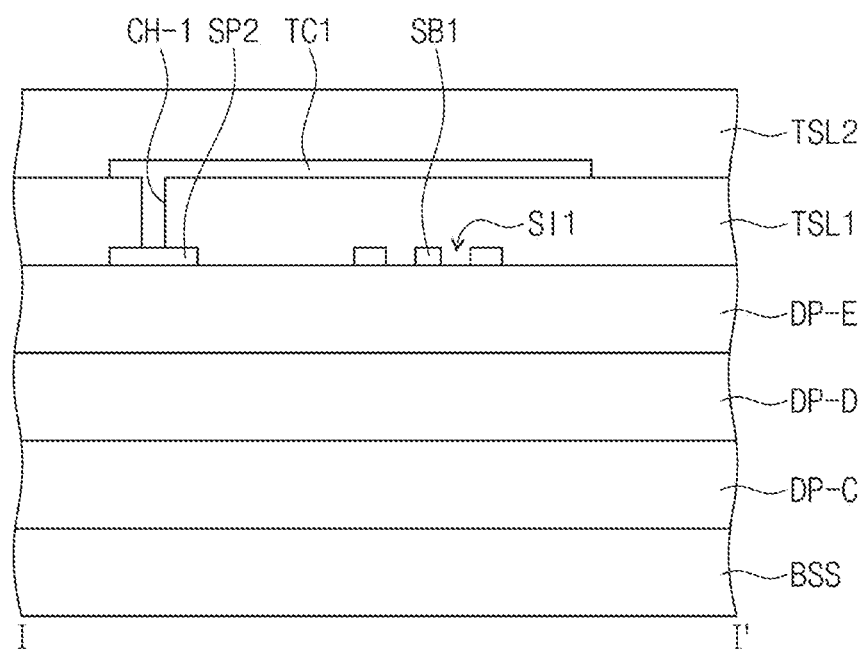
FIG. 10 is a cross-sectional view taken along line of FIG. 9.

FIG. 7 is a cross-sectional view taken along line II-II' of FIG. 2. FIGS. 8 and 9 are plan views of an area XX' of FIG. 2. FIG. 7 may substantially correspond to a cross-sectional view of the area XX'. FIGS. 8 and 9 schematically illustrate portions of the constituents of the display panel EP. FIG. 10 is a cross-sectional view taken along line of FIG. 9. Particularly, FIG. 8 illustrates a portion of the pixels PX and the signal lines, and FIG. 9 illustrates the input sensing unit ISU (see FIG. 6). Hereinafter, the inventive concept will be described with reference to FIGS. 7 to 10.

The hole area HA may be surrounded by the active area AA on the plane. In FIGS. 7 an 8, for convenience of description, the hole area HA is shown by a dotted line. The pixels PX may be disposed to be spaced apart from the module hole MR, and a portion of the pixels PX, which is disposed adjacent to the hole area HA, may be disposed along an edge of the hole area HA.

Referring to FIG. 7, the module hole MH is defined in the hole area HA. The module hole MH may be defined in a center of the hole area HA. The module hole MH may be a through-hole to pass through the display panel EP. The module hole MH passes through the front and rear surfaces of the base substrate BSS. In particular, the module hole MH passes through the constituents, which are disposed on the hole area HA, on the layers disposed on the front surface of the base substrate BSS. Thus, the first insulation layer 10, the second insulation layer 20, the third insulation layer 30, the control layer EL, the first inorganic layer IOL1, the second inorganic layer IOL2, which extend up to the hole area HA, may be penetrated to define a side surface of the module hole MH.

The display panel EP according to this exemplary embodiment may further include a recess pattern GV defined in the hole area HA. The recess pattern GV may be defined along an edge of the module hole MH. In this exemplary embodiment, the recess pattern GV may surround the module hole MH. The recess pattern GV may have a circular shape similar to that of the module hole MH on the plane, but is not limited thereto. For example, the recess pattern GV may have a shape different from that of the module hole MR, may have a close line shape including a polygonal shape, an oval shape, or at least partial circular shape, or may be provided in a shape including a plurality of partially cut patterns, but is not limited to any one specific exemplary embodiment.

The recess pattern GV may be a pattern that is recessed from the front surface of the display panel EP. A portion of the constituents of the display panel EP may be removed to form the recess pattern GV. The recess pattern GV may not pass through the display panel EP, unlike the module hole MH. Thus, the rear surface of the bass substrate BSS overlapping the recess pattern GV may not be opened by the recess pattern GV.

The recess pattern GV may be defined to pass through the rest constituents except for a portion of the base layer BS. In this exemplary embodiment, the recess pattern GV may be formed by connecting the through-part defined in the auxiliary layer BL to the recess part defined in the base layer BS. An inner surface of the recess pattern GV may be covered by the first inorganic layer IOL1 and the second inorganic layer IOL2.

The recess pattern GV may have an under-cut shape including a tip part TP protruding inward. The tip part TP according to this exemplary embodiment may be formed so that a portion of the auxiliary layer BL further protrudes to the inside of the recess pattern GV than the base layer BS. The display panel EP according to an the inventive concept may have various layer structure as long as the tip part TP is provided on the recess pattern GV, but is not limited to any one specific exemplary embodiment.

The display panel EP may further include a predetermined organic pattern EL-P disposed in the recess pattern GV. The organic pattern EL-P may be made of the same material as the control layer EL. Alternatively, the organic pattern EL-P may further include the same material as the second electrode E2. The organic pattern EL-P may have a single layer or multilayered structure.

The organic pattern EL-P may be disposed in the recess pattern GV by being spaced apart from the control layer EL and the second electrode E2. The organic pattern EL-P may be covered by the first inorganic layer IOL1 and thus, may not be exposed to the outside.

According to the inventive concept, the recess pattern GV cuts off the continuity of the control layer EL connected from the side surface of the module hole MH to the active area AA. The control layer EL may be disconnected at the area overlapping the recess pattern GV. The control layer EL may serve as a moving path for external contaminations such as moisture or air. The layer exposed by the module hole MH, for example, a path through which the moisture or air introduced from the control layer EL is introduced into the active area AA via the hole area HA, may be covered by the recess pattern GV. Thus, the display panel EP in which the module hole MH is defined may have improved reliability.

The recess pattern GV includes a first recess pattern GV1 and a second recess pattern GV2. On the plane, the first recess pattern GV1 surrounds the module hole MH, and the second recess pattern GV2 surrounds the first recess pattern GV1. The module hole MH, the first recess pattern GV1, and the second recess pattern GV2 may be spaced apart from each other. In this exemplary embodiment, the first recess pattern GV1 and the second recess pattern GV2 may have substantially the same shape. However, the inventive concept is not limited thereto. The first recess pattern GV1 and the second recess pattern GV2 may have shapes different from each other. According to another exemplary embodiment of the inventive concept, the recess pattern GV may further include at least one groove that is spaced apart from the second recess pattern GV2 and surrounds the second recess pattern GV2.

The first inorganic layer IOL1 may extend up to an area on which the first and second recess patterns GV1 and GV2 are disposed. The first inorganic layer IOL1 may be disposed on areas adjacent to the first and second recess patterns GV1 and GV2 and along inner surfaces of the first and second recess patterns GV1 and GV2. Thus, the inside of each of the first and second recess patterns GV1 and GV2 may be covered by the first inorganic layer IOL1.

The encapsulation layer DP-E may be filled into the second recess pattern GV2, but may not be filled into the first recess pattern GV1.

The second inorganic layer IOL2 may extend up to an area on which the first and second recess patterns GV1 and GV2 are disposed. The second inorganic layer IOL2 may be disposed on areas adjacent to the first and second recess patterns GV1 and GV2 and along the inner surface of the first recess pattern GV1.

Thus, the inside of the first recess pattern GV1 may be covered by the second inorganic layer IOL2. Since an organic layer OL of the encapsulation layer DP-E is filled into the second recess pattern GV2, the second inorganic layer IOL2 may not be disposed on the inner surface of the second recess pattern GV2. The organic layer OL may be disposed between the first inorganic layer IOL1 and the second inorganic layer IOL2 in an area overlapping the second recess pattern GV2.

The first conductive layer MTL1 and the second conductive layer MTL2 may be disposed to overlap the second recess pattern GV2 within the hole area HA. That is, in the case of the structure in which the organic layer OL is filled into the second recess pattern GV2, the first conductive layer MTL1 and the second conductive layer MTL2 may be disposed to overlap the second recess pattern GV2 and thus be disposed closer to the module hole MH.

In the display panel EP according to another exemplary embodiment of the inventive concept, the, the recess pattern GV may be omitted.

As described above, the pixels PX and the input sensing unit ISU are disposed to be spaced apart from the module hole MH on the plane. Hereinafter, referring to FIGS. 8 and 9, the module hole MH and the pixels PX and the input sensing unit ISU in the vicinity of the module hole MH will be described.

Referring to FIG. 7, a routing area RA may be further defined in the hole area HA. The routing area RA may be defined outside the module hole MH. The routing area RA may surround the module hole MR.

Referring to FIG. 8, the pixels PX may be arranged to surround the hole area HA. Portions of the pixels PX may be arranged along an edge of the hole area HA. The pixels PX may be spaced apart from the module hole MH on the plane.

A plurality of signal lines SL1, SL2, SL3, and SL4 connected to the pixels PX may be disposed on the hole area HA. The signal lines SL1, SL2, SL3, and SL4 may be connected to the pixels PX via the routing area RA. In FIG. 8, for convenience of description, an example in which a first signal line SL1, a second signal line SL2, a third signal line SL3, and a fourth signal line SL4 of the plurality of signal lines connected to the pixels PX are illustrated.

In the active area AA, the first signal line SL1 extends in the first direction DR1. The first signal line SL1 is connected to the pixels within the same row arranged in the first direction DR1 of the pixels PX. The first signal line SL1 may correspond to the data line 16 (see FIG. 4).

In the routing area RA, the first signal line SL1 may have a bent shape. FIG. 8 illustrates an example in which the first signal line SL1 draws a semicircle along an outline of the module hole MH in the routing area RA.

A portion of the pixels PX connected to the first signal line SL1 may be disposed above the module hole MH, and other portion of the pixels PX may be disposed below the module hole MH. Thus, the pixels within the same row connected to the first signal line SL1 may receive a data signal through the same line even though a portion of the pixels with respect to the module hole MH is omitted.

In the active area AA, the second signal line SL2 extends in the second direction DR2. The second signal line SL2 is connected to the pixels within the same row arranged in the second direction DR2 of the pixels PX. The second signal line SL2 may correspond to the gate line 14 (see FIG. 4).

In the routing area RA, the second signal line SL2 may have a bent shape. FIG. 8 illustrates an example in which the second signal line SL2 follows a semicircular route along outlines of the module hole MH and the recess pattern GV in the routing area RA.

A portion of the pixels PX connected to the second signal line SL2 may be disposed at the left side of the module hole MH, and other portion of the pixels PX may be disposed at the right side of the module hole MH. Thus, the pixels within the same row connected to the second signal line SL2 may be turned on/off by substantially the same gate signal even though a portion of the pixels with respect to the module hole MH is omitted.

The display panel EP according to an exemplary embodiment of the inventive concept may further include a connection pattern disposed on the routing area RA. Here, the first signal line SL1 may be disconnected at the area overlapping the hole area HA. The disconnected portion of the first signal line SL1 may be connected through the connection pattern. Here, the connection pattern may be disposed on a layer different from that on which the first signal line SL1 is disposed and be connected to the first signal line SL1 through a contact hole. Similarly, the second signal line SL2 may be disconnected at the area overlapping the hole area HA, and a connection pattern of the second signal line SL2 connecting the disconnected portion of the second signal line may be further provided. Here, the connection pattern may be disposed on a layer different from that on which the second signal line SL2 is disposed and be connected to the second signal line SL2 through a contact hole.

In the active area AA, the third signal line SL3 extends in the first direction DR1, and the fourth signal line SL4 extends in the second direction DR2. The third signal line SL3 may be spaced apart from the first signal line SL1, and the fourth signal line SL4 may be spaced apart from the second signal line SL2.

In the routing area RA, each of the third signal line SL3 and the fourth signal line SL4 may have a bent shape. FIG. 8 illustrates an example in which the third signal line SL3 and the fourth signal line SL4 follows a semicircular route along outlines of the module hole MH and the recess pattern GV in the routing area RA.

Each of the third signal line SL3 and the fourth signal line SL4 may be one of the light emitting line 15, the power line 26, and the initialization voltage line 22, which are described with reference to FIG. 4.

Referring to FIGS. 9 and 10, the sensing touch sensing parts SP1 and the transmission touch sensing parts SP2 are spaced apart from each other.

Each of the sensing touch sensing parts SP1 and the transmission touch sensing parts SP2 may include a plurality of mesh lines MSL crossing the first direction DR1 and the second direction DR2. The mesh lines MSL may include a first mesh line MSL1 extending in one direction and a second mesh line MSL2 extending in a direction crossing the first mesh line MSL1. The first mesh line MSL1 and the second mesh line MSL2 may be connected to each other to form the sensing touch sensing parts SP1 and the transmission touch sensing parts SP2, which have a net shape.

The second connection parts CP2 are arranged in the second direction DR2. Each of the second connection parts CP2 connects the two sensing touch sensing parts SP1, which are adjacent in the first direction DR1, to each other. The second connection parts CP2 may be constituted by the first mesh line MSL1 and the second mesh line MSL2.

The first connection parts CP1 extend in the first direction DR1. Each of the first connection parts CP1 connects the two transmission touch sensing parts SP2, which are adjacent in the second direction DR2, to each other. Although not shown, each of the first connection parts CP1 may have a bar shape and be constituted by the first mesh line MSL1 and the second mesh line MSL2.

In this exemplary embodiment, the sensing touch sensing parts SP1, the transmission touch sensing parts SP2, and the second connection parts CP2, which are described with reference to FIG. 4, may be disposed on the same layer, and the first connection parts CP1 may be disposed on a different layer. Since the second connection parts CP2 and the first connection parts CP1 are disposed on the layers different from each other, even though the second connection parts CP2 and the first connection parts CP1 are disposed to cross each other on the plane, the second connection parts CP2 and the first connection parts CP1 may be electrically insulated from each other. The second connection parts CP2 may be directly connected to the sensing touch sensing parts SP1, and the first connection parts CP1 may be connected to the transmission touch sensing parts SP2 through contact holes CH1.

In this exemplary embodiment, a portion of the sensing touch sensing parts SP1 and the transmission touch sensing parts SP2 may be disconnected with respect to the module hole MH.

A portion of the transmission touch sensing parts SP2 may be separated into an upper portion and a lower portion with respect to the module hole MH. A portion of the transmission touch sensing parts SP2 may have a shape of which a portion overlapping the hole area HA is removed. A portion of the transmission touch sensing parts SP2 having the shape of which a portion overlapping the hole area HA is removed may be defined as a transmission touch pattern ST. The transmission touch pattern ST may include a first transmission touch pattern ST1 disposed on one side of the hole area HA in the first direction DR1 and a second transmission touch pattern ST2 disposed on the other side of the hole area HA in the first direction DR1.

A portion of the sensing touch sensing parts SP1 may be separated into a left portion and a right portion with respect to the module hole MH. A portion of the sensing touch sensing parts SP1 may have a shape of which a portion overlapping the hole area HA is removed. A portion of the sensing touch sensing parts SP1 having the shape of which a portion overlapping the hole area HA is removed may be defined as a sensing touch pattern RT. The sensing touch pattern RT may include a first sensing touch pattern RT1 disposed on one side of the hole area HA in the second direction DR2 and a second sensing touch pattern RT2 disposed on the other side of the hole area HA in the second direction DR2.

In the display panel EP according to an exemplary embodiment of the inventiveconcept, the input sensing unit ISU may further include a sensing bridge pattern SBL and a transmission bridge pattern TBL. The sensing bridge pattern SBL and the transmission bridge pattern TBL electrically connect the disconnected touch sensing parts via the routing area RA. Particularly, the sensing bridge pattern SBL may connect the first sensing touch pattern RT1 to the second sensing touch pattern RT2, and the transmission bridge pattern TBL may connect the first transmission pattern ST1 to the second transmission pattern ST2.

In the following exemplary embodiment, the sensing bridge pattern SBL may be defined as a first bridge pattern, and the transmission bridge pattern TBL may be defined as a second bridge pattern.

The sensing bridge pattern SBL and the transmission bridge pattern TBL may be disposed on layers different from each other. In this embodiment, the sensing bridge pattern SBL may be disposed on the same as the sensing touch sensing part SP1, the second connection parts SP2, and the transmission touch sensing parts SP2, and the transmission bridge pattern TBL may be disposed on the same layer as the first connection parts CP1. That is, the sensing bridge pattern SBL may be provided in the first conductive layer MTL1 described with reference to FIG. 5, and the transmission bridge pattern TBL may be provided in the second conductive layer MTL 2 described with respect to FIG. 5.

The sensing bridge pattern SBL may be directly connected to the first sensing touch pattern RT1 and the second sensing touch pattern RT2. The transmission bridge pattern TBL may be connected to the first transmission touch pattern ST1 and the second transmission touch pattern ST2 through contact holes CH-1, CH-2, CH-3, and CH-4. The contact holes CH-1, CH-2, CH-3, and CH-4 may be provided in the first touch insulation layer TSL1 of FIG. 4.

According to the inventive concept, the sensing bridge pattern SBL may include a first sensing bridge pattern SBL1 and a second sensing bridge pattern SBL2. The first sensing bridge pattern SBL1 and the second sensing bridge pattern SBL2 may be spaced apart from each other. The first sensing bridge pattern SBL1 and the second sensing bridge pattern SBL2 may complementally serve to electrically connect the first and second sensing touch patterns RT1 and RT2 to each other. Also, since each of the first and second sensing bridge patterns SBL1 and SBL2 has a length that is relatively greater than that of the second connection part CP2, two sensing bridge patterns SBL may be provided to reduce resistance.

The first sensing bridge pattern SBL1 may be disposed via an upper region of the module hoe MH within the routing area RA. The second sensing bridge pattern SBL2 may be disposed via a lower region of the module hoe MH within the routing area RA.

The first sensing bridge pattern SBL1 may include a first sensing body pattern SB1, a first sensing connection pattern SC1, and a second sensing connection pattern SC2. The first sensing body pattern SB1, the first sensing connection pattern SC1, and the second sensing connection pattern SC2 are randomly distinguished from each other so as to explain the shape of the first sensing bridge SBL1 and thus are substantially provided as a single body.

The first sensing body pattern SB1 may be disposed via an upper region of the module hoe MH within the routing area RA. The first sensing pattern SB1 may have a bent shape.

The first sensing connection pattern SC1 extends from one end of the first sensing body pattern SB1 and is connected to the first sensing touch pattern RT1. In this exemplary embodiment, the first sensing connection pattern SC1 contacts the first sensing touch pattern RT1.

The second sensing connection pattern SC2 extends from the other end of the first sensing body pattern SB1 and is connected to the second sensing touch pattern RT2. In this exemplary embodiment, the second sensing connection pattern SC2 contacts the first sensing touch pattern RT2.

The first sensing body pattern SB1 may have a width greater than that of each of the first sensing connection pattern SC1 and the second sensing connection pattern SC2. The width of the first sensing body pattern SB1 may be controlled to adjust resistance of the first sensing bridge pattern SBL1.

Each of the first sensing connection pattern SC1 and the second sensing connection pattern SC2 may be provided in plurality. Thus, even though a portion of the plurality of first sensing connection patterns SC1 and a portion of the plurality of second sensing connection patterns SC2 are disconnected from each other, the first sensing touch pattern RT1 and the second sensing touch pattern RT2 may be electrically connected to each other.

The second sensing bridge pattern SBL2 may include a second sensing body pattern SB2, a third sensing connection pattern SC3, and a fourth sensing connection pattern SC4. The second sensing bridge pattern SBL2 has substantially the same shape as the first sensing bridge pattern SBL1, and thus, its detailed description will be omitted.

According to the inventive concept, the transmission bridge pattern TBL may include a first transmission bridge pattern TBL1 and a second transmission bridge pattern TBL2. The first transmission bridge pattern TBL1 and the second transmission bridge pattern TBL2 may be spaced apart from each other. The first transmission bridge pattern TBL1 and the second transmission bridge pattern TBL2 may complementally serve to electrically connect the first and second transmission touch patterns ST1 and ST2 to each other. Also, since each of the first and second transmission bridge patterns TBL1 and TBL2 has a length that is relatively greater than that of the first connection part CP1, two transmission bridge patterns TBL may be provided to reduce resistance.

The first transmission bridge pattern TBL1 may be disposed via a left region of the module hoe MH within the routing area RA. The first transmission bridge pattern TBL1 may have one end connected to the first transmission touch pattern ST1 through the contact hole CH-1 and the other end connected to the second transmission touch pattern ST2 through the contact hole CH-2.

The second transmission bridge pattern TBL2 may be disposed via a right region of the module hoe MH within the routing area RA. The second transmission bridge pattern TBL2 may have one end connected to the first transmission touch pattern ST1 through the contact hole CH-3 and the other end connected to the second transmission touch pattern ST2 through the contact hole CH-4.

The first transmission bridge pattern TBL1 may include a first transmission body pattern TB1, a first transmission connection pattern TC1, and a second transmission connection pattern TC2. The first transmission body pattern TB1, the first transmission connection pattern TC1, and the second transmission connection pattern TC2 are randomly distinguished from each other so as to explain the shape of the first transmission bridge TBL1 and thus are substantially provided as a single body.

The first transmission body pattern TB1 may be disposed via the left region of the module hoe MH within the routing area RA. The first transmission body pattern TB1 may have a bent shape.

The first transmission connection pattern TC1 extends from one end of the first transmission body pattern TB1 and is connected to the first transmission touch pattern ST1 through the contact hole CH-1.

The second transmission connection pattern TC2 extends from the other end of the first transmission body pattern TB1 and is connected to the second transmission touch pattern ST2 through the contact hole CH-2.

The first transmission body pattern TB1 may have a width greater than that of each of the first transmission connection pattern TC1 and the second transmission connection pattern TC2. The width of the first transmission body pattern TB1 may be controlled to adjust resistance of the first transmission bridge pattern TBL1.

Each of the first transmission connection pattern TC1 and the second transmission connection pattern TC2 may be provided in plurality. Thus, even though a portion of the plurality of first transmission connection patterns TC1 and a portion of the plurality of second transmission connection patterns TC2 are disconnected from each other, the first transmission touch pattern ST1 and the second transmission touch pattern ST2 may be electrically connected to each other.

The second transmission bridge pattern TBL2 may include a second transmission body pattern TB2, a third transmission connection pattern TC3, and a fourth transmission connection pattern TC4. The second transmission bridge pattern TBL2 has substantially the same shape as the first transmission bridge pattern TBL1, and thus, its detailed description will be omitted.

In the display apparatus according to the inventive concept, the pixels or the touch sensing parts, which are spaced apart from each other with respect to the module hole, may be connected to each other through the signal lines or the bridge patterns to maintain the organic/electrical coupling between the pixels or the touch sensing parts, which are spaced apart from each other with respect to the module hole, thereby facilitating the electrical control with respect to the pixels. Thus, even though the module hole is defined in the area surrounded by the active area, the active area of the display apparatus may be stably driven.

According to the inventive concept, the sensing touch pattern RT and the transmission touch pattern ST, which are adjacent to the module hole MR, may be relatively low touch sensitivity in the vicinity of the module hole MR when compared to the active area AA because a portion of the electrode is removed.

The first and second sensing bridge patterns SBL1 and SBL2 and the first and second transmission bridge patterns TBL1 and TBL2 may form the capacitor within the routing area RA to compensate the insufficient touch sensitivity of the sensing touch pattern RT and the transmission touch pattern ST.

Slits SI1, SI2, SI3, and SI4 may be provided in portions of the first and second sensing bridge patterns SBL1 and SBL2 and the first and second transmission bridge patterns TBL1 and TBL2. The slits SI1, SI2, SI3, and SI4 may be provided in intersection parts between the first and second sensing bridge patterns SBL1 and SBL2 and the first and second transmission bridge patterns TBL1 and TBL2.

In this exemplary embodiment, an example in which the first slit SI1 and the second slit SI2 are provided in the first sensing bridge pattern SBL1, and the third slit SI3 and the fourth slit SI4 are provided in the second sensing bridge pattern SBL2 are illustrated.

The first slit SI1 may be provided in the intersection between the first sensing body pattern SB1 and the first transmission connection pattern TC1, the second slit SI2 may be provided in the intersection between the first sensing body pattern SB1 and the third transmission connection pattern TC3, the third slit SI3 may be provided in the intersection between the second sensing body pattern SB2 and the second transmission connection pattern TC2, and the fourth slit SI4 may be provided in the intersection between the second sensing body pattern SB2 and the fourth transmission connection pattern TC4. The first to fourth slits SI1, SI2, SI3, and SI4 may overlap the corresponding first to fourth transmission connection patterns TC1, TC2, TC3, and TC4.

Overlapping areas between the first and second sensing bridge patterns SBL1 and SBL2 and the first and second transmission bridge patterns TBL1 and TBL2 may be minimized by the first to fourth slits SI1, SI2, SI3, and SI4. Thus, the first and second sensing bridge patterns SBL1 and SBL2 and the first and second transmission bridge patterns TBL1 and TBL2 may be prevented from being short-circuited with each other to minimize a signal interference.

However, the inventive concept is not limited thereto. According to another exemplary embodiment of the inventive concept, one of the first sensing bridge pattern SBL1 and the second sensing bridge pattern SBL2 may be omitted, and one of the first transmission bridge pattern TBL1 and the second transmission bridge pattern TBL2 may be omitted.

Although not shown, according to another exemplary embodiment of the inventive concept, when each of the module hole MH and the module region HA has a size that is enough to overlap two or more transmission touch lines (portions of the transmission touch lines TX1 to TX4 of FIG. 6) and two or more sensing touch lines (portions of the sensing touch lines RX1 to RX5 of FIG. 6), the first sensing bridge pattern SBL1 and the second sensing bridge pattern SBL2 may be connected to the sensing touch patterns provided in the sensing touch lines (portions of the sensing touch lines RX1 to RX5 of FIG. 6) different from each other. Similarly, the first transmission bridge pattern TBL1 and the second transmission bridge pattern TBL2 may be connected to the transmission touch patterns provided in the transmission touch lines (portions of the transmission touch lines TX1 to TX4 of FIG. 6) different from each other.

The input sensing unit ISU may further include a dummy pattern DT, as shown in FIG. 9. The dummy pattern DT may be disposed between the first and second sensing bridge patterns SBL1 and SBL2 and the first and second transmission bridge patterns TBL1 and TBL2. The dummy pattern DT may be disposed to be spaced apart from the first and second sensing bridge patterns SBL1 and SBL2 and the first and second transmission bridge patterns TBL1 and TBL2.

The dummy pattern DT may be provided in the first conductive layer MTL1 and the second conductive layer MTL2, which are described with reference to FIG. 5.

The dummy pattern DT may prevent the area between the first and second sensing bridge patterns SBL1 and SBL2 and the first and second transmission bridge patterns TBL1 and TBL2 from being seen as spots.

Figure 11:
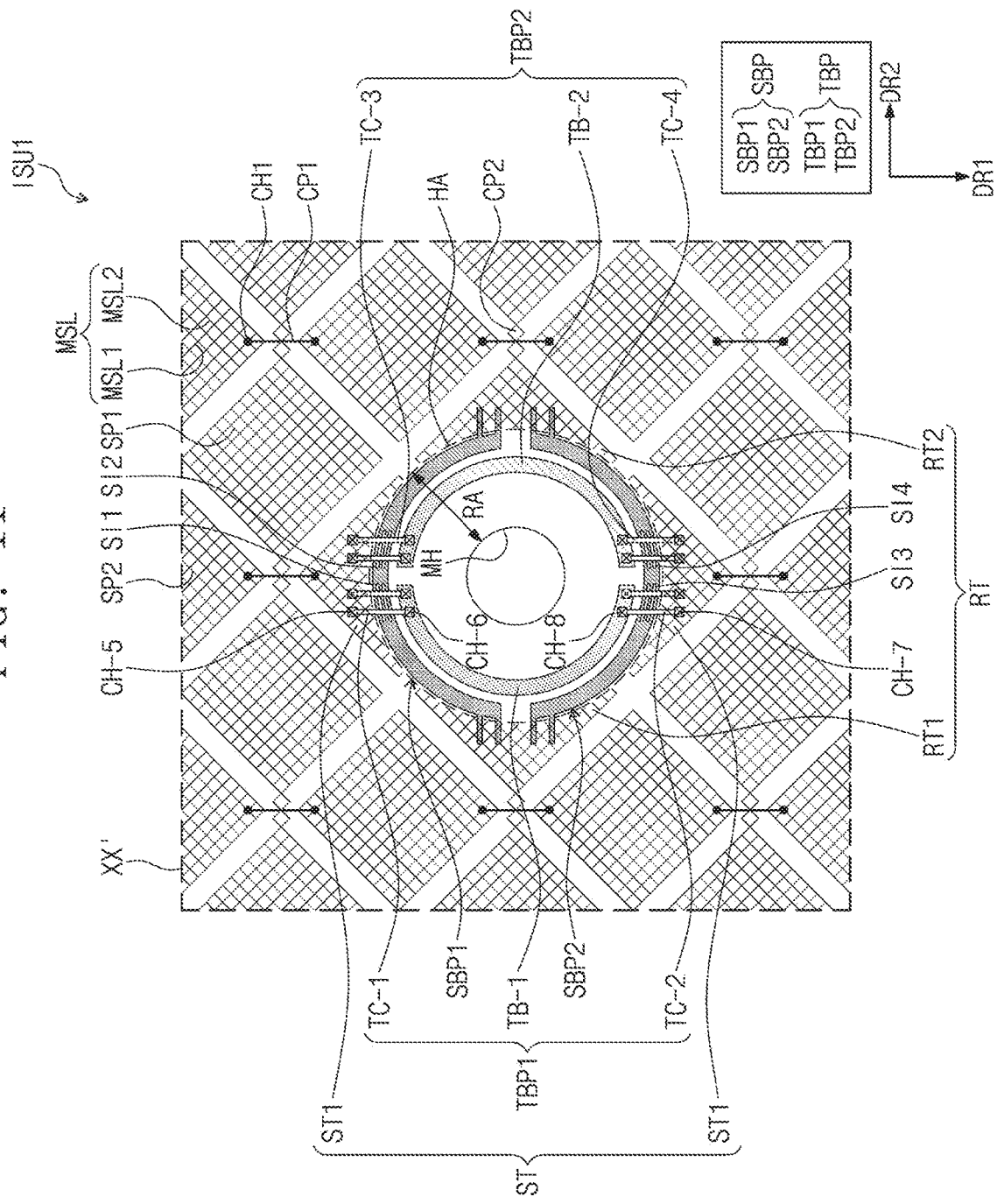
FIGS. 11, 12, 13, and 14 are plan views of an area XX' of FIG. 2 according to another exemplary embodiment of the inventive concept.

FIG. 11 is a plan view illustrating a portion of an input sensing unit according to another exemplary embodiment of the inventive concept. FIG. 11 illustrates an area XX' of FIG. 2 according to another exemplary embodiment of the inventive concept.

A difference between an input sensing unit ISU1 described with reference to FIG. 11 and the input sensing unit ISU described with reference to FIG. 9 will be mainly described, and the constituents that are not described will be derived from the description of FIG. 9.

Referring to FIG. 11, the input sensing unit ISU may include a sensing bridge pattern SBP and a transmission bridge pattern TBP.

The sensing bridge pattern SBP may include a first sensing bridge pattern SBP1 and a second sensing bridge pattern SBP2. The first sensing bridge pattern SBP1 and the second sensing bridge pattern SBP2 are substantially the same as the first sensing bridge pattern SBL1 and the second sensing bridge pattern SBL2, which are described with reference to FIG. 9, and thus, their detailed descriptions will be omitted.

The transmission bridge pattern TBP may include a first transmission bridge pattern TBP1 and a second transmission bridge pattern TBP2.

The first transmission bridge pattern TBP1 may include a first transmission body pattern TB-1, a first transmission connection pattern TC-1, and a second transmission connection pattern TC-2. The second transmission bridge pattern TBP2 may include a second transmission body pattern TB-2, a third transmission connection pattern TC-3, and a fourth transmission connection pattern TC-4.

The first to fourth transmission connection patterns TC-1, TC-2, TC-3, and TC-4 may be disposed on a layer different from that on which the first transmission body pattern TB-1 is disposed. In this exemplary embodiment, the first sensing bridge pattern SBP1, the second sensing bridge pattern SBP2, the first transmission body pattern TB-1, and the second transmission body pattern TB-2 may be disposed on the same layer.

Each of the first transmission bridge pattern TB-1 and the second transmission bridge pattern TB-2 has substantially the same shape as each of the first transmission bridge pattern TB1 and the second transmission bridge pattern TB2, which are described with reference to FIG. 9, and thus, their detailed descriptions will be omitted.

The first transmission connection pattern TC-1 may have one end connected to a first transmission touch pattern ST1 through a contact hole CH-5 and the other end connected to the first transmission body pattern TB-1 through a contact hole CH-6.

The second transmission connection pattern TC-2 may have one end connected to a second transmission touch pattern ST2 through a contact hole CH-7 and the other end connected to the first transmission body pattern TB-1 through a contact hole CH-8.

A first slit SI1 and a second slit SI2 are provided in the first sensing bridge pattern SBP1, and a third slit SI3 and a fourth slit SI4 are provided in the second sensing bridge pattern SBP2. The first sensing bridge pattern SBP1 and the second sensing bridge pattern SBP2 are substantially the same as the first sensing bridge pattern SBL1 and the second sensing bridge pattern SBL2, which are described with reference to FIG. 9, and thus, their detailed descriptions will be omitted.

Figure 12:
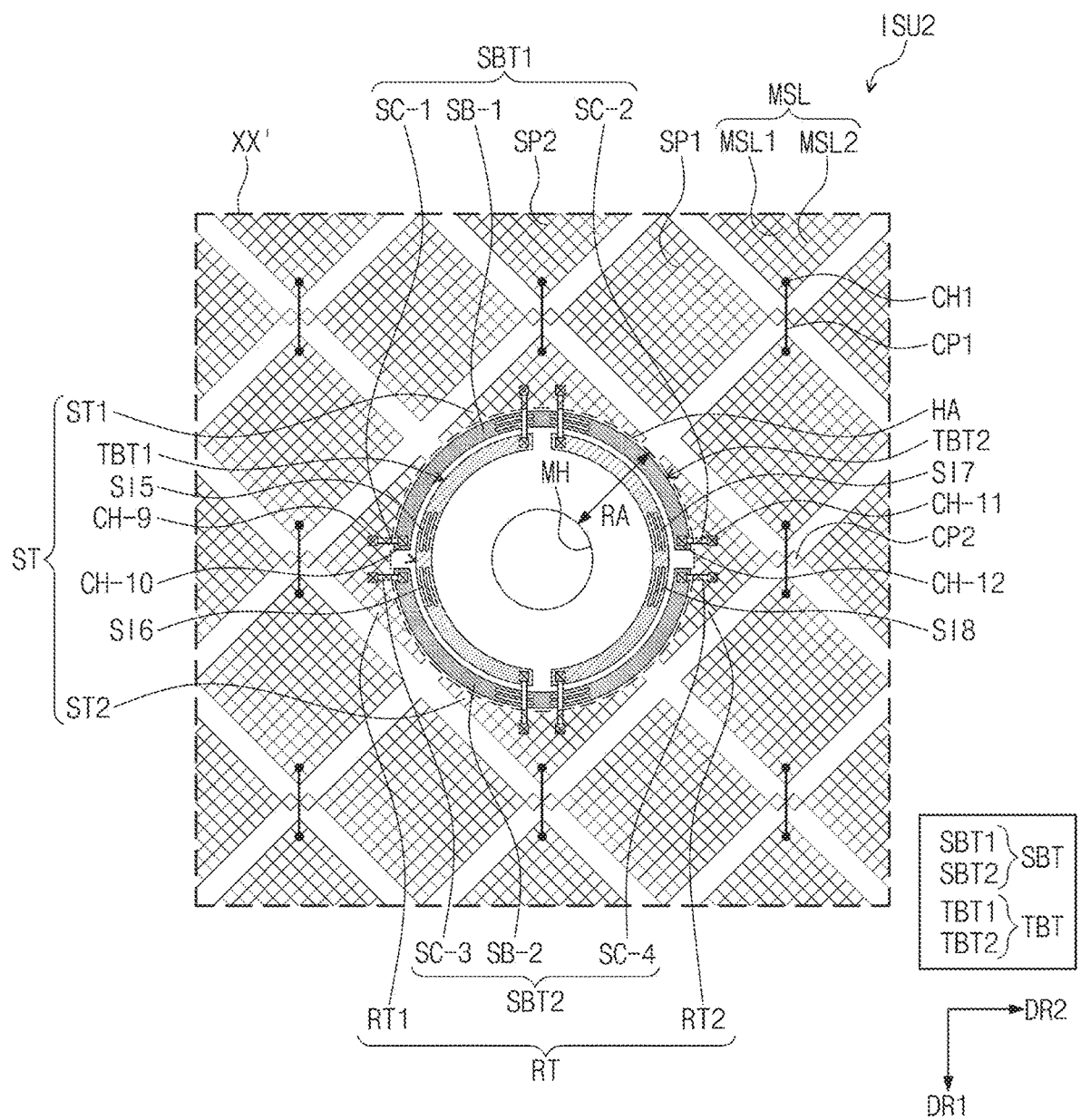

FIG. 12 is a plan view illustrating a portion of an input sensing unit according to an exemplary embodiment of the inventive concept. FIG. 12 illustrates an area XX' of FIG. 2 according to another exemplary embodiment of the inventive concept.

A difference between an input sensing unit ISU2 described with reference to FIG. 12 and the input sensing unit ISU1 described with reference to FIG. 11 will be mainly described, and the constituents that are not described will be derived from the description of FIG. 11.

Referring to FIG. 12, the input sensing unit ISU2 may include a sensing bridge pattern SBT and a transmission bridge pattern TBT.

The transmission bridge pattern TBT may include a first transmission bridge pattern TBT1 and a second transmission bridge pattern TBT2. The first transmission bridge pattern TBT1 and the second transmission bridge pattern TBT2 are substantially the same as the first transmission bridge pattern TBP1 and the second transmission bridge pattern TBP2, which are described with reference to FIG. 11, and thus, their detailed descriptions will be omitted.

The sensing bridge pattern SBT may include a first sensing bridge pattern SBT1 and a second sensing bridge pattern SBT2.

The first sensing bridge pattern SBT1 may include a first sensing body pattern SB-1, a first sensing connection pattern SC-1, and a second sensing connection pattern SC-2. The second sensing bridge pattern SBL2 may include a second sensing body pattern SB-2, a third sensing connection pattern SC-3, and a fourth sensing connection pattern SC-4.

The first to fourth sensing connection patterns SC-1, SC-2, SC-3, and SC-4 may be disposed on a layer different from that on which the first sensing body pattern SB-1 is disposed. In this embodiment, the first transmission bridge pattern TBT1, the second transmission bridge pattern TBT2, the first sensing body pattern SB-1, and the second sensing body pattern SB-2 may be disposed on the same layer. The first to fourth sensing connection patterns SC-1, SC-2, SC-3, and SC-4 may be disposed on the same layer as the first to fourth transmission connection patterns TC-1, TC-2, TC-3, and TC-4, which are described with reference to FIG. 11.

Each of the first sensing body pattern SB-1 and the second sensing body pattern SB-2 has substantially the same shape as each of the first sensing body pattern SB1 and the second sensing body pattern SB2, which are described with reference to FIG. 9, and thus, their detailed descriptions will be omitted.

The first sensing connection pattern SC-1 may have one end connected to the first sensing touch pattern RT1 through a contact hole CH-9 and the other end connected to the first sensing body pattern SB-1 through a contact hole CH-10.

The second sensing connection pattern SC-2 may have one end connected to the second sensing touch pattern RT1 through a contact hole CH-11 and the other end connected to the first sensing body pattern SB-1 through a contact hole CH-12.

A slit may be provided in a portion of an area of the first transmission bridge pattern TBT1 crossing the first and second sensing bridge patterns SBT1 and SBT2. Also, a slit may be provided in a portion of an area of the second transmission bridge pattern TBT2 crossing the first and second sensing bridge patterns SBT1 and SBT2.

An example in which a fifth slit SI5 and a sixth slit SI6 are provided in the first transmission bridge pattern TBT1, and a seventh slit SI7 and an eighth slit SI8 are provided in the second transmission bridge pattern TBT2 are illustrated.

The fifth slit SI5 may be provided in an intersection between the first sensing connection pattern SC-1 and the first transmission bridge pattern TBT1, the sixth slit SI6 may be provided in an intersection between the third sensing connection pattern SC-3 and the first transmission bridge pattern TBT1, the seventh slit SI7 may be provided in an intersection between the second sensing connection pattern SC-2 and the second transmission bridge pattern TBT2, and the eighth slit SI8 may be provided in an intersection between the fourth sensing connection pattern SC-4 and the fourth transmission bridge pattern TBT2.

Overlapping areas between the first and second transmission bridge patterns TBT1 and TBT2 and the first and second sensing bridge patterns SBT1 and SBT2 may be minimized by the first to eighth slits SI1 to SI8. Thus, the first and second sensing bridge patterns SBT1 and SBT2 and the first and second transmission bridge patterns TBT1 and TBT2 may be prevented from being short-circuited with each other to minimize signal interference.

Figure 13:
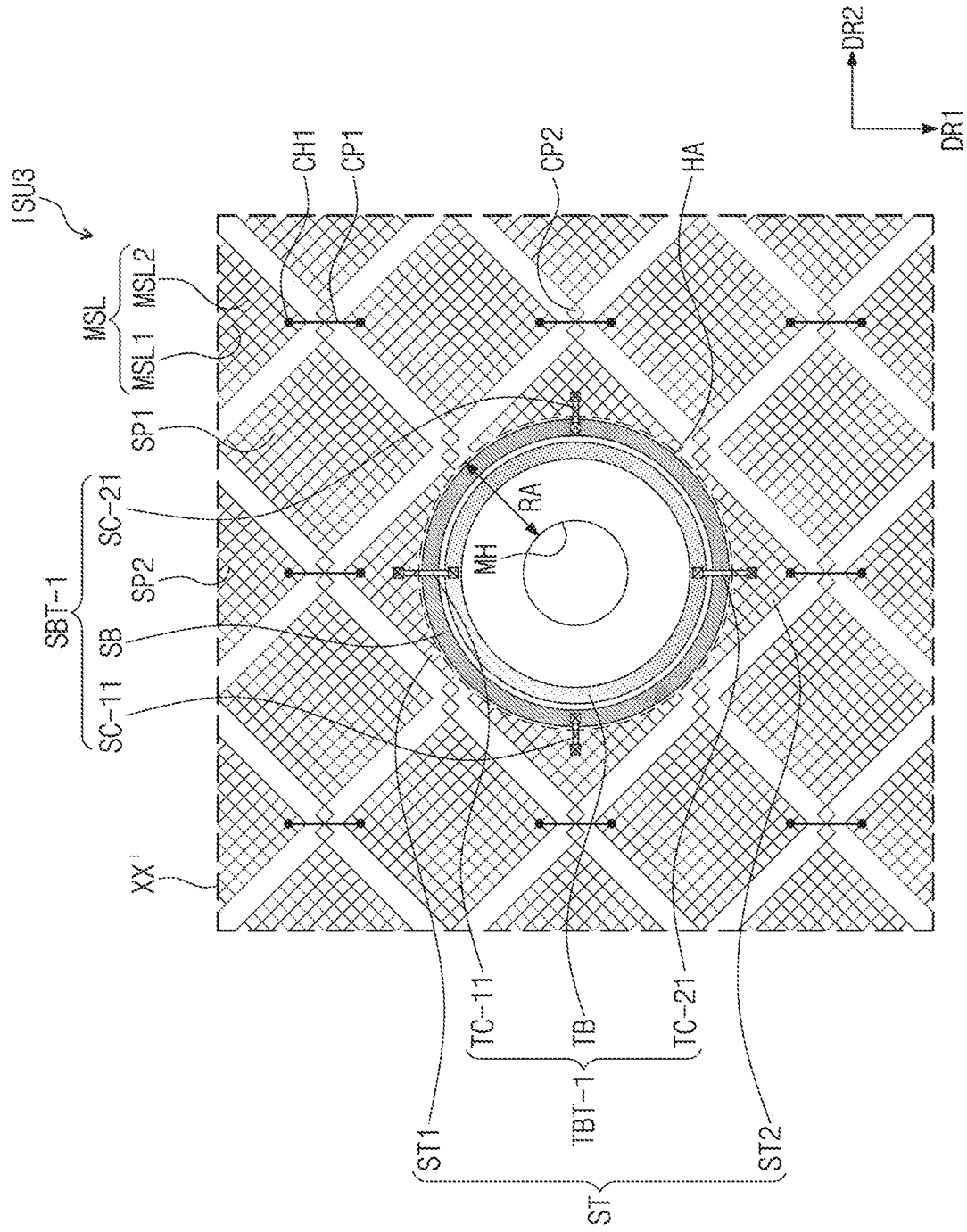

FIG. 13 is a plan view illustrating a portion of an input sensing unit according to another exemplary embodiment of the inventive concept. FIG. 13 illustrates an area XX' of FIG. 2 according to another exemplary embodiment of the inventive concept.

A difference between an input sensing unit ISU3 described with reference to FIG. 13 and the input sensing unit ISU2 described with reference to FIG. 12 will be mainly described, and the constituents that are not described will be derived from the description of FIG. 12.

The input sensing unit ISU3 may include a sensing bridge pattern SBT-1 and a transmission bridge pattern TBT-1.

The sensing bridge pattern SBT-1 may include a sensing body pattern SB, a first sensing connection pattern SC-11, and a second sensing connection pattern SC-21.

The sensing body pattern SB may have a shape in which the first sensing body pattern SB-1 and the second sensing body pattern SB-2 of FIG. 12 are connected to each other. The sensing body pattern SB may surround a module hole MH and have an annular shape.

The first sensing connection pattern SC-11 may have substantially the same shape as one of the first sensing connection pattern SC-1 and the third sensing connection pattern SC-3 of FIG. 12.

The second sensing connection pattern SC-21 may have substantially the same shape as one of the second sensing connection pattern SC-2 and the fourth sensing connection pattern SC-4 of FIG. 12.

The transmission bridge pattern TBP1-1 may include a transmission body pattern TB, a first transmission connection pattern TC-11, and a second transmission connection pattern TC-21.

The transmission body pattern TB may have a shape in which the first transmission body pattern TB-1 and the second transmission body pattern TB-2 of FIG. 12 are connected to each other. The transmission body pattern TB may surround a module hole MH and have an annular shape. Although the transmission body pattern TB surrounds the sensing body pattern SB in this exemplary embodiment, the inventive concept is not limited thereto. According to another exemplary embodiment, the sensing body pattern may surround the transmission body pattern.

The first transmission connection pattern TC-11 may have substantially the same shape as one of the first transmission connection pattern TC-1 and the third transmission connection pattern TC-3 of FIG. 11.

The second transmission connection pattern TC-21 may have the same shape as one of the second transmission connection pattern TC-2 and the fourth transmission connection pattern TC-4 of FIG. 11.

Figure 14:
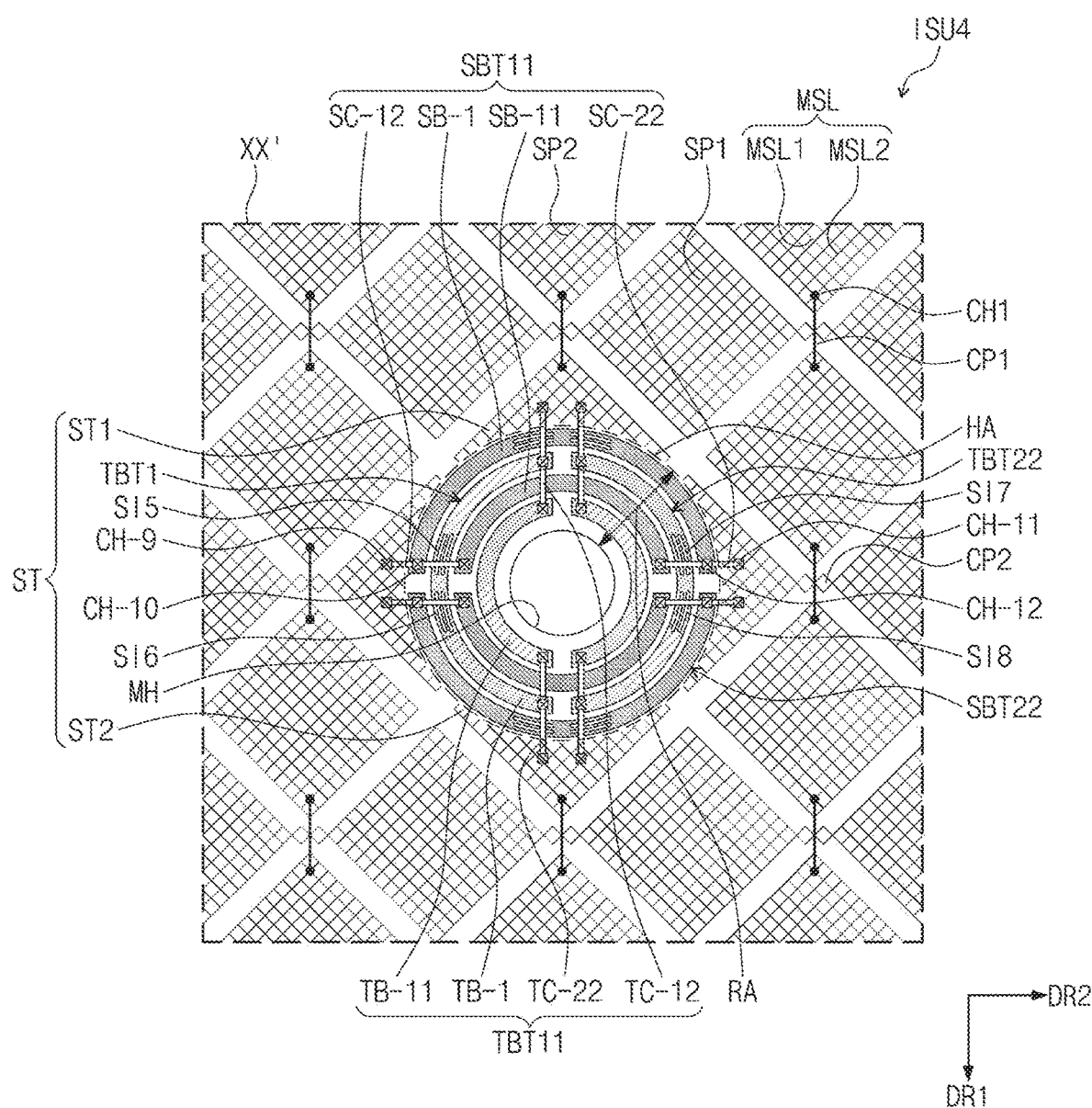

FIG. 14 is a plan view illustrating a portion of an input sensing unit according to an exemplary embodiment of the inventive concept. FIG. 14 illustrates an area XX' of FIG. 2 according to another exemplary embodiment of the inventive concept.

A difference between an input sensing unit ISU4 described with reference to FIG. 14 and the input sensing unit ISU2 described with reference to FIG. 12 will be mainly described, and the constituents that are not described will be derived from the description of FIG. 12.

Referring to FIG. 14, a sensing bridge pattern of the input sensing unit ISU4 may include a first sensing bridge pattern SBT11 and a second sensing bridge pattern SBT22, and a transmission bridge pattern of the input sensing unit ISU4 may include a first transmission bridge pattern TBT11 and a second transmission bridge pattern TBT22.

The first sensing bridge pattern SBT11 may include a first sensing body pattern SB-1, a first auxiliary sensing pattern SB-11, a first sensing connection pattern SC-12, and a second sensing connection pattern SC-22.

The first auxiliary sensing pattern SB-11 may be disposed between the first sensing body pattern SB-1 and a module hole MH. The first transmission body pattern TB-1 may be disposed on a portion of an area between the first sensing body pattern SB-1 and the first auxiliary sensing pattern SB-11.

The first sensing connection pattern SC-12 connects a first sensing touch pattern RT1, the first sensing body patter SB-1, and the first auxiliary sensing pattern SB-11 to each other.

The second sensing connection pattern SC-22 connects a second sensing touch pattern RT2, the first sensing body patter SB-1, and the first auxiliary sensing pattern SB-11 to each other.

The second sensing bridge pattern SBT22 has a structure that is symmetrical to that of the first sensing bridge pattern SBT11, and thus, its detailed description will be omitted.

The first transmission bridge pattern TBT11 may include a first transmission body pattern TB-1, a first auxiliary transmission pattern TB-11, a first transmission connection pattern TC-12, and a second transmission connection pattern TC-22.

The first auxiliary transmission pattern TB-11 may be disposed between the first transmission body pattern TB-1 and a module hole MH. The first auxiliary sensing pattern SB-11 may be disposed on a portion of an area between the first transmission body pattern TB-1 and the first auxiliary transmission pattern TB-11.

The first transmission connection pattern TC-12 connects a first transmission touch pattern ST1, the first transmission body patter TB-1, and the first auxiliary transmission pattern TB-11 to each other.

The second transmission connection pattern TC-22 connects a second transmission touch pattern ST2, the first transmission body patter TB-1, and the first auxiliary transmission pattern TB-11 to each other.

The second transmission bridge pattern TBT22 has a structure that is symmetrical to that of the first transmission bridge pattern TBT11, and thus, its detailed description will be omitted.

According to an exemplary embodiment of the inventive concept, a capacitor formed by the sensing bridge pattern and the transmission bridge pattern may increase in capacitance by the first auxiliary transmission pattern TB-11 and the first auxiliary sensing pattern SB-11 when compared to that of FIG. 12.

A display apparatus including the input sensing unit ISU4 described with reference to FIG. 14 may further include the first auxiliary sensing pattern and the second auxiliary sensing pattern when compared to the input sensing unit ISU2 of FIG. 12 to further compensate for the insufficient sensitivity of the sensing touch pattern RT and the transmission touch pattern ST.

In the display apparatus according to the exemplary embodiments of the inventive concept, the pixels or the touch sensing parts, which are spaced apart from each other with respect to the module hole, may be connected to each other through the signal lines or the bridge patterns to maintain the organic/electrical coupling between the pixels or the touch sensing parts, which are spaced apart from each other with respect to the module hole, thereby facilitating the electrical control with respect to the pixels. Thus, even though the module hole is defined in the area surrounded by the active area, the active area of the display apparatus may be stably driven.

Also, the sensing bridge patterns and the transmission bridge patterns may form the capacitor in the routing region to compensate the insufficient touch sensitivity of the sensing touch pattern and the transmission touch pattern.

Also, at least a portion of the sensing bridge patterns and the transmission bridge patterns may include the slit to minimize the overlapping area between the sensing bridge patterns and the transmission bridge patterns, thereby preventing the short circuit from occurring.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a base substrate comprising front and rear surfaces facing each other, in which a module hole passing through the first and rear surfaces is defined, and on which an active area, a peripheral area adjacent to the active area, and a routing area surrounding the module hole are defined on a plane;
a circuit layer disposed on the base substrate and comprising a driving element comprising a thin film transistor;
a display element layer disposed on the circuit layer and comprising a light emitting element disposed on the active area;
an encapsulation layer disposed on the display element layer to seal the light emitting element; and
an input sensing unit disposed on the encapsulation layer, wherein:
the input sensing unit comprises:
first touch sensing parts arranged in a first direction;
a first connection part configured to connect the adjacent first touch sensing parts to each other;
second touch sensing parts arranged in a second direction crossing the first direction;
a second connection part configured to connect the adjacent second touch sensing parts to each other and disposed on a layer different from that on which the first connection part is disposed;
a first bridge pattern connected to the second touch sensing parts adjacent to each other in the second direction with the module hole therebetween and disposed within the routing area; and
a second bridge pattern connected to the first touch sensing parts adjacent to each other in the first direction with the module hole therebetween and disposed within the routing area;
a first slit is provided in the first bridge pattern to overlap the second bridge pattern; and
a second slit is provided in the second bridge pattern to overlap the first bridge pattern.

2. The display apparatus of claim 1, wherein the first slit is provided in an intersection between the first bridge pattern and the second bridge pattern.

3. The display apparatus of claim 1, wherein the first bridge pattern and the second bridge pattern are disposed on layers different from each other.

4. The display apparatus of claim 1, wherein:
the first touch sensing parts, the second touch sensing parts, the second connection part, and the first bridge pattern are disposed on the same layer; and
the second bridge pattern is disposed on the same layer as the first connection part.

5. The display apparatus of claim 1, wherein the input sensing unit further comprises:
a first touch insulation layer disposed on the first touch sensing parts, the second touch sensing parts, the second connection part, and the first bridge pattern; and
a second touch insulation layer disposed on the first connection part and the first touch insulation layer,
wherein the second bridge pattern is connected to the first touch sensing part through a contact hole provided in the first touch insulation layer.

6. The display apparatus of claim 1, wherein:
the first bridge pattern comprises:
a sensing body pattern disposed within the routing area and having a bent shape;
a first sensing connection pattern extending from one end of the sensing body pattern and connected to one of the second touch sensing parts; and
a second sensing connection pattern extending from the other end of the sensing body pattern and connected to the other one of the second touch sensing parts; and
the sensing body pattern has a width greater than that of each of the first sensing connection pattern and the second sensing connection pattern.

7. The display apparatus of claim 1, wherein:
the second bridge pattern comprises:
a transmission body pattern disposed within the routing area and having a bent shape;
a first transmission connection pattern connected to one end of the transmission body pattern and connected one of the first touch sensing parts; and
a second transmission connection pattern connected to the other end of the transmission body pattern and connected to the other one of the first touch sensing parts; and
the transmission body pattern has a width greater than that of each of the first transmission connection pattern and the second transmission connection pattern.

8. The display apparatus of claim 7, wherein the transmission body pattern is disposed on a layer different from layers on which each of the first and second transmission connection patterns is disposed.

9. The display apparatus of claim 8, wherein:
the first touch sensing parts, the second touch sensing parts, the second connection part, the first bridge pattern, and the transmission body pattern are disposed on the same layer; and
the first transmission connection pattern, the second transmission connection pattern, and the first connection part are disposed on the same layer.

10. The display apparatus of claim 1, wherein:
the first bridge pattern comprises:
a sensing body pattern disposed within the routing area and having a bent shape;
a first sensing connection pattern connected to one end of the sensing body pattern, connected to one of the second touch sensing parts, and disposed on a layer different from that on which the sensing body pattern is disposed; and
a second sensing connection pattern connected to the other of the sensing body pattern, connected to the other one of the second touch sensing parts, and disposed on a layer different from that on which the sensing body pattern is disposed; and
the second bridge pattern comprises:
a transmission body pattern disposed within the routing area and having a bent shape;
a first transmission connection pattern connected to one end of the transmission body pattern, connected to one of the first touch sensing parts, and disposed on a layer different from that on which the transmission body pattern is disposed; and a second transmission connection pattern connected to the other of the transmission body pattern, connected to the other one of the first touch sensing parts, and disposed on a layer different from that on which the transmission body pattern is disposed.

11. The display apparatus of claim 10, wherein:
the first touch sensing parts, the second touch sensing parts, the second connection part, the sensing body pattern, and the transmission body pattern are disposed on the same layer; and
the first sensing connection pattern, the second sensing connection pattern, the first transmission connection pattern, and the second transmission connection part are disposed on the same layer.

12. The display apparatus of claim 10, wherein each of the sensing body pattern and the transmission body pattern surrounds the module hole and has an annular shape.

13. The display apparatus of claim 10, wherein:
the first bridge pattern further comprises an auxiliary sensing pattern disposed between the sensing body pattern and the module hole;
each of the first and second sensing connection patterns is connected to the auxiliary sensing pattern;
the second bridge pattern further comprises an auxiliary transmission pattern disposed between the transmission body pattern and the module hole; and
each of the first and second transmission connection patterns is connected to the auxiliary transmission pattern.

14. The display apparatus of claim 1, wherein the input sensing unit further comprises a dummy pattern disposed within the routing area and disposed between the first bridge pattern and the second bridge pattern.

15. The display apparatus of claim 1, wherein the routing area is surrounded by the active area on the plane.

16. A display apparatus comprising:
a base substrate comprising front and rear surfaces facing each other, in which a module hole passing through the first and rear surfaces is defined, and on which an active area, a peripheral area adjacent to the active area, and a routing area surrounding the module hole are defined on a plane;
a circuit layer disposed on the base substrate and comprising a thin film transistor;
a display element layer disposed on the circuit layer and comprising a light emitting element disposed on the active area;
an encapsulation layer disposed on the display element layer to seal the light emitting element; and
a sensing unit disposed on the encapsulation layer,
wherein:
the input sensing unit comprises:
a first touch line comprising first touch sensing parts arranged in a first direction;
a second touch line comprising second touch sensing parts arranged in a second direction crossing the first direction and insulated from the first touch line;
a first bridge pattern which is disposed within the routing area and connected to the second touch sensing parts adjacent to each other in the second direction with the module hole therebetween; and
a second bridge pattern disposed within the routing area and connected to the first touch sensing parts adjacent to each other in the first direction with the module hole therebetween;
a first slit is provided in the first bridge pattern to overlap the second bridge pattern; and
a second slit is provided in the second bridge pattern to overlap the first bridge pattern.

17. The display apparatus of claim 16, wherein:
the first slit is provided in an intersection between the first bridge pattern and the second bridge pattern.

18. The display apparatus of claim 16, wherein a recess pattern configured to surround the module hole is disposed between the routing area and the module hole in the base substrate.

* * * * *